(12) United States Patent
Okita et al.

(10) Patent No.: US 10,269,813 B2
(45) Date of Patent: Apr. 23, 2019

(54) SEMICONDUCTOR DEVICE AND METHOD OF MANUFACTURING THE SAME

(71) Applicant: FUJITSU SEMICONDUCTOR LIMITED, Yokohama-shi, Kanagawa (JP)

(72) Inventors: Youichi Okita, Aizuwakamatsu (JP); Hideki Ito, Aizuwakamatsu (JP); Wensheng Wang, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 15/886,411

(22) Filed: Feb. 1, 2018

(65) Prior Publication Data

US 2018/0175049 A1 Jun. 21, 2018

Related U.S. Application Data

(62) Division of application No. 14/980,071, filed on Dec. 28, 2015, now Pat. No. 9,917,092.

(30) Foreign Application Priority Data

Jan. 20, 2015 (JP) ................. 2015-008640

(51) Int. Cl.
    *H01L 27/11507* (2017.01)
    *H01L 49/02* (2006.01)

(52) U.S. Cl.
    CPC ........ *H01L 27/11507* (2013.01); *H01L 28/56* (2013.01); *H01L 28/57* (2013.01)

(58) Field of Classification Search
    CPC ..... H01L 27/11507; H01L 28/56; H01L 28/57
    See application file for complete search history.

(56) References Cited

U.S. PATENT DOCUMENTS

| 2003/0178663 A1 | 9/2003 | Sashida |
| 2005/0136554 A1 | 6/2005 | Okita et al. |

(Continued)

FOREIGN PATENT DOCUMENTS

| JP | 2005-183843 A | 7/2005 |
| JP | 2010-3741 A | 1/2010 |

(Continued)

OTHER PUBLICATIONS

Non-Final Office Action dated Mar. 8, 2017, issued in U.S. Appl. No. 14/980,071. (15 pages).

(Continued)

*Primary Examiner* — Cheung Lee
*Assistant Examiner* — Stephen C Smith
(74) *Attorney, Agent, or Firm* — Westerman, Hattori, Daniels & Adrian, LLP

(57) ABSTRACT

A method of manufacturing a semiconductor device includes: forming an insulating film above a semiconductor substrate; forming a conductive film on the insulating film; forming a dielectric film on the conductive film; forming a plurality of upper electrodes at intervals on the dielectric film; forming a first protective insulating film on the upper electrodes and the dielectric film by a sputtering method; forming a second protective insulating film on the first protective insulating film by an atomic layer deposition method, thereby filling gaps of a grain boundary of the dielectric film with the second protective insulating film; and patterning the conductive film after the second protective insulating film is formed to provide a lower electrode.

6 Claims, 45 Drawing Sheets

(56) References Cited

U.S. PATENT DOCUMENTS

2010/0055805 A1   3/2010   Wang
2012/0032299 A1   2/2012   Wang
2013/0026603 A1   1/2013   Wang

FOREIGN PATENT DOCUMENTS

JP    2011-155268 A    8/2011
JP    2012-38906 A     2/2012

OTHER PUBLICATIONS

Final Office Action dated Jul. 21, 2017, issued in U.S. Appl. No. 14/980,071. (11 pages).

Notice of Allowance dated Nov. 27, 2017, issued in U.S. Appl. No. 14/980,071. (8 pages).

Office Action dated Jul. 3, 2018, issued in counterpart Japanese Application No. 2015-008640, with English machine translation. (7 pages).

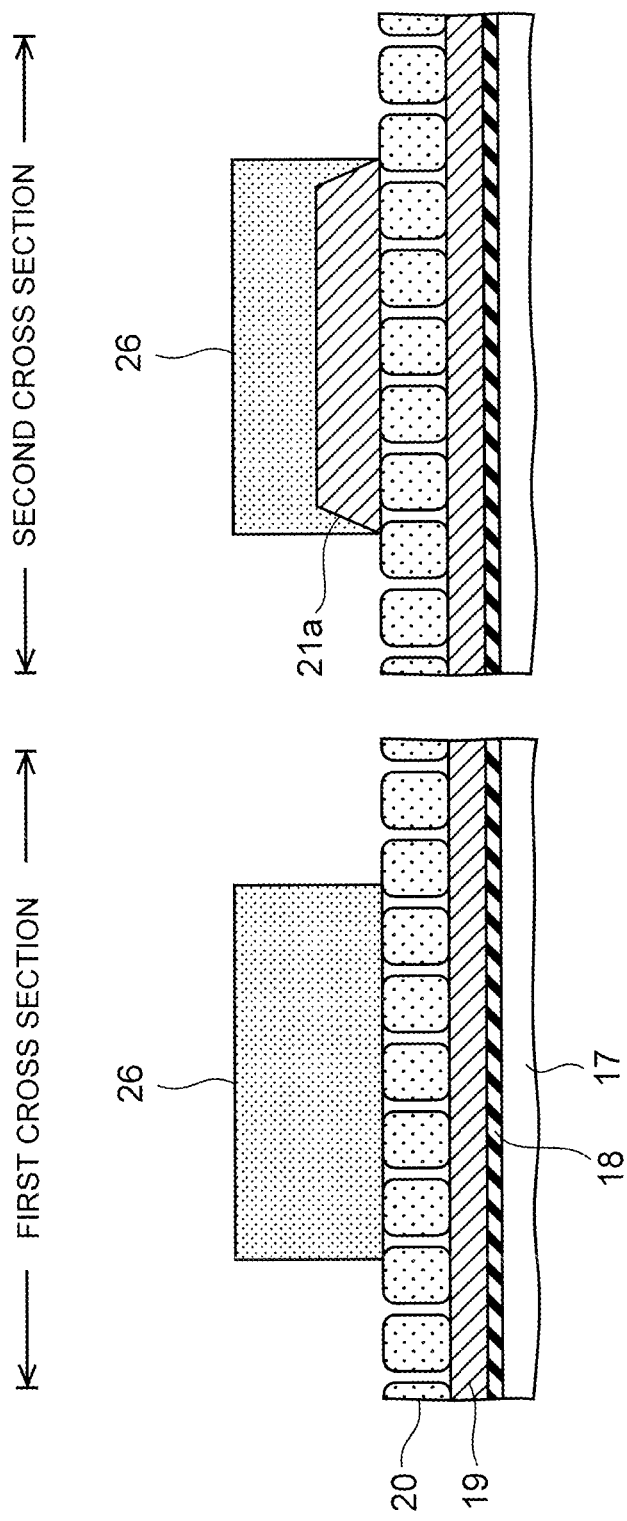

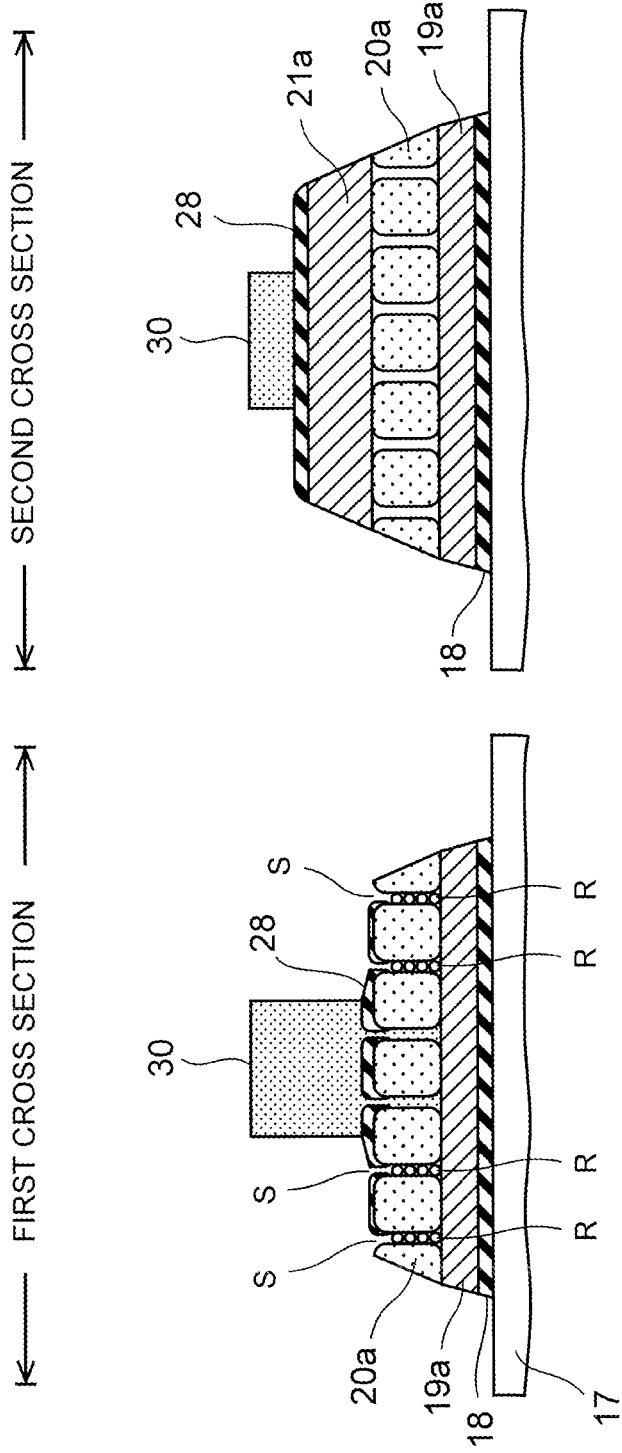

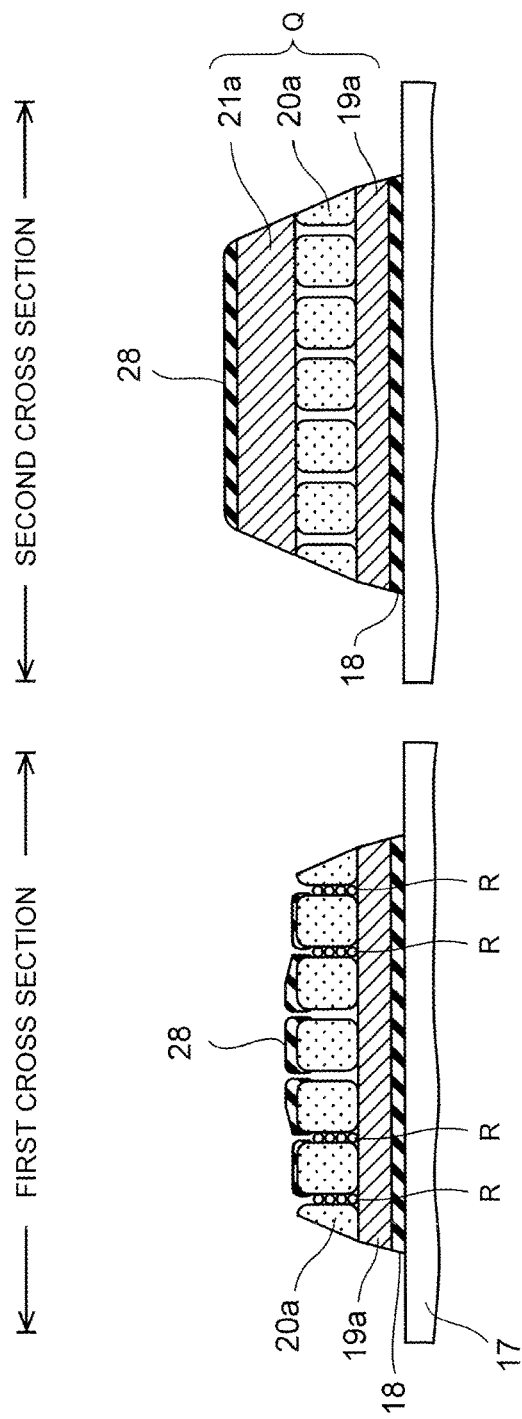

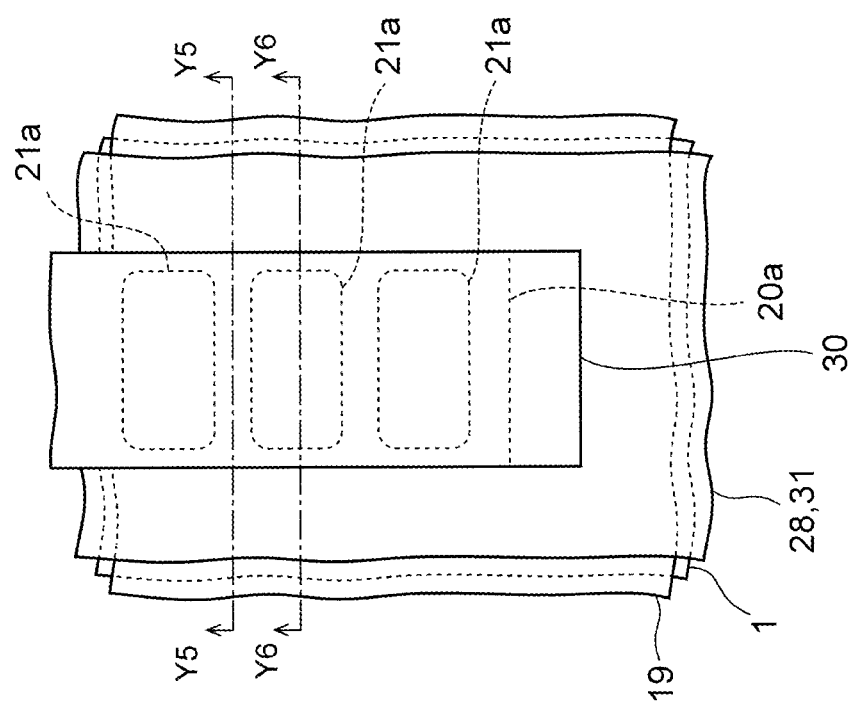

SEMICONDUCTOR DEVICE AND METHOD OF MANUFACTURING THE SAME

CROSS-REFERENCE TO RELATED APPLICATION

This application is a Divisional Application of U.S. patent application Ser. No. 14/980,071, filed on Dec. 28, 2015, which is based upon and claims the benefit of priority of the prior Japanese Patent Application No. 2015-008640, filed on Jan. 20, 2015, the entire contents of which are incorporated herein by reference.

FIELD

The embodiments discussed herein are related to a semiconductor device and a method of manufacturing the same.

BACKGROUND

Ferroelectric memories such as ferroelectric random access memories (FeRAM) are known in addition to flash memories as non-volatile memories which do not lose information even after the power supply is turned off.

A ferroelectric memory includes a ferroelectric capacitor which uses a ferroelectric film as a capacitor dielectric film. The ferroelectric memory stores information therein by associating the polarization directions of the ferroelectric film with "0" and "1", and has an advantage of a high-speed data operation with low-power consumption compared with the flash memory.

However, there is still room for further improvement in the ferroelectric memory in terms of improvement in the yield.

Note that, technologies related to the present application are disclosed in Japanese Laid-open Patent Publication No. 2012-38906, Japanese Laid-open Patent Publication No. 2011-155268, and Japanese Laid-open Patent Publication No. 2005-183843.

SUMMARY

An aspect disclosed in the following provides a method of manufacturing a semiconductor device, the method including: forming an insulating film above a semiconductor substrate; forming a conductive film on the insulating film; forming a dielectric film on the conductive film, the dielectric film being including a ferroelectric; forming a plurality of upper electrodes at intervals on the dielectric film; forming a first protective insulating film on the upper electrodes and the dielectric film by a sputtering method; forming a second protective insulating film on the first protective insulating film by an atomic layer deposition method, thereby filling gaps generated along a grain boundary of the dielectric film with the second protective insulating film; and patterning the conductive film after the second protective insulating film is formed to provide a lower electrode, thereby forming a ferroelectric capacitor including the upper electrodes, the dielectric film, and the lower electrode.

Another aspect of the disclosure provides a semiconductor device including: an insulating film formed above a semiconductor substrate; a lower electrode formed on the insulating film; a dielectric film formed on the lower electrode, the dielectric film being including a ferroelectric and having gaps generated along a grain boundary of the dielectric film; a plurality of upper electrodes formed at intervals on the dielectric film to form a ferroelectric capacitor together with the lower electrode and the dielectric film; a first protective insulating film formed on portions of the dielectric film excluding the gaps, and on the upper electrodes; and a second protective insulating film formed on the first protective insulating film and on the dielectric film in the gaps, such that the gaps are filled with the second protective insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2A to FIG. 2J are enlarged cross-sectional views of a ferroelectric capacitor in the course of manufacture included in the semiconductor device which the present inventors study;

FIG. 10A to FIG. 10G are enlarged plan views of the ferroelectric capacitor in the course of manufacture included in the semiconductor device according to the present embodiment.

DESCRIPTION OF EMBODIMENT

Prior to an explanation of the present embodiment, the matters studied by the present inventors will be described.

A ferroelectric film such as a PZT film is used as a capacitor dielectric film in a ferroelectric capacitor. When the ferroelectric film is exposed to a reducing substance such as moisture or hydrogen, the reduction of the ferroelectric film occurs, causing deterioration of the ferroelectric characteristics of the ferroelectric film such as the residual polarization charge amount.

As for a method of preventing the ferroelectric characteristics from deteriorating in this manner, a method including covering a ferroelectric capacitor with a protective insulating film which blocks a reducing substance such as hydrogen is available.

As for a film which may be used as the protective insulating film, an alumina film, through which hydrogen is difficult to pass, is available.

The present inventors study problems which occur when using such a protective insulating film, as follows.

FIG. 1A to FIG. 1D are cross-sectional views of a semiconductor device in the course of manufacture which the present inventors study.

The semiconductor device is a FeRAM of a planar type, and is manufactured as follows.

Figure 1A:
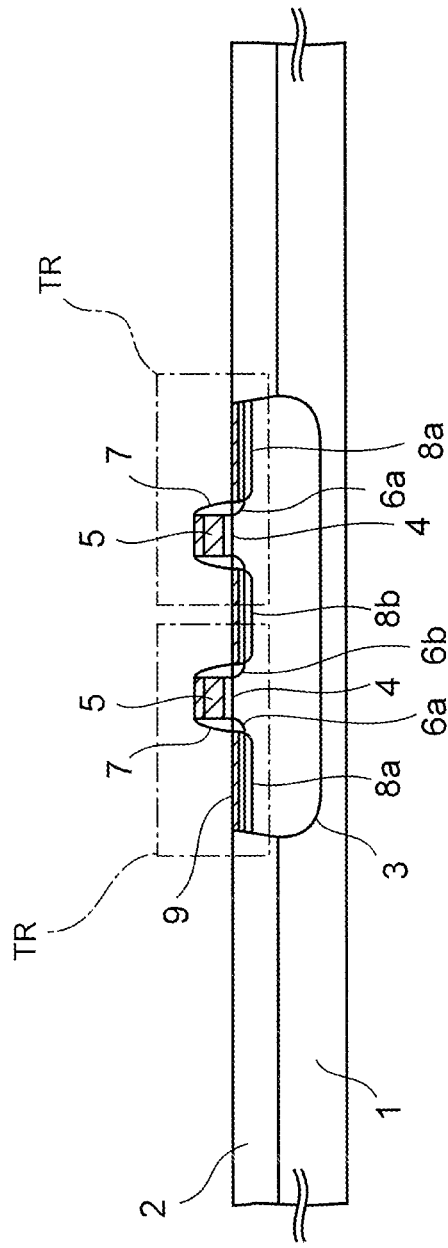
FIG. 1A to FIG. 1D are cross-sectional views of a semiconductor device in the course of manufacture which the present inventors study.

Firstly, steps for obtaining a structure illustrated in the cross-sectional view in FIG. 1A will be described.

A groove for shallow trench isolation (STI) defining an active region of transistors is firstly formed on a surface of an n-type or p-type silicon (semiconductor) substrate 1, and an insulating film such as silicon oxide is embedded into the groove to obtain an element isolation insulating film 2. The element isolation structure is not limited to the STI; alternatively, the element isolation insulating film 2 may be formed by a local oxidation of silicon (LOCOS) method.

A p-type impurity is then introduced into the active region in the silicon substrate 1 to form a p-well 3, and thereafter, a surface of the active region is thermally oxidized to form a thermal oxide film serving as a gate insulating film 4.

A polycrystalline silicon film is subsequently formed with a thickness of approximately 200 nm on the entire upper surface of the silicon substrate 1, and the polycrystalline silicon film thus formed is patterned by photo lithography and etching to form a gate electrode 5.

Two gate electrodes 5 are disposed substantially parallel on the p-well 3 with an interval, and those gate electrodes 5 constitute a portion of a word line.

The material of the gate electrode 5 is not limited to the polycrystalline silicon film. Instead of the polycrystalline silicon film, an amorphous silicon film having a thickness of approximately 50 nm and a tungsten silicide film having a thickness of approximately 150 nm may be formed in this order.

An n-type impurity such as phosphorus is then introduced into portions of the silicon substrate 1 on sides of each gate electrode 5 by ion implantation which uses the gate electrode 5 as a mask to form n-type source-drain extensions 6a and 6b.

An insulating film is thereafter formed on the entire upper surface of the silicon substrate 1, and the insulating film is etched back and left at the sides of the gate electrode 5 as insulating side walls 7. A silicon oxide film is formed as the insulating film by a chemical vapor deposition (CVD) method, for example.

The n-type impurity such as arsenic is subsequently ion-implanted again into the silicon substrate 1 while using the insulating side walls 7 and the gate electrodes 5 as a mask to form n-type source-drain regions 8a and 8b in the silicon substrate 1 at the lateral sides of the gate electrode 5.

The n-type source-drain region 8b sandwiched between the two gate electrodes 5 functions as a portion of a bit line, and the two n-type source-drain regions 8a at the both sides in the p-well 3 are electrically connected to upper electrodes of a capacitor, which is described later.

A high-melting point metal layer such as a cobalt layer is then formed by a sputtering method on the entire upper surface of the silicon substrate 1, and thereafter, this high-melting point metal layer is heated and reacted with silicon to form a high-melting point metal silicide layer 9 on the silicon substrate 1. The high-melting point metal silicide layer 9 is also formed on a surface layer portion of the gate electrode 5, thereby resulting in the low resistance of the gate electrode 5.

The high-melting point metal layer remaining unreacted on the element isolation insulating film 2 and the like is thereafter removed by wet etching.

With the foregoing steps, the basic structure of n-type metal oxide semiconductor (MOS) transistors TR which include the gate electrodes 5 and the n-type source-drain regions 8a and 8b, and the like is completed on the p-well 3.

Figure 1B:
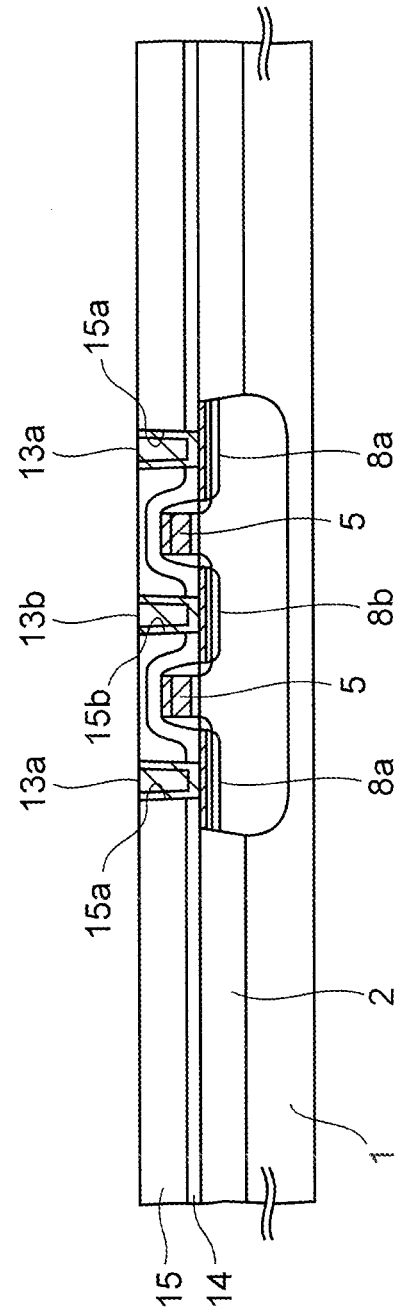

Next, as illustrated in FIG. 1B, a silicon oxy-nitride film serving as a cover insulating film 14 is formed with a thickness of approximately 200 nm on the entire upper surface of the silicon substrate 1.

A silicon oxide film serving as a first interlayer insulating film 15 is then formed with a thickness of approximately 1000 nm on the cover insulating film 14 by a plasma CVD method which uses TEOS gas, and thereafter, the upper surface of the first interlayer insulating film 15 is polished by a chemical mechanical polishing (CMP) to be planarized. The thickness of the first interlayer insulating film 15 after polished in this manner is approximately 785 nm on the flat surface of the silicon substrate 1.

The cover insulating film 14 and the first interlayer insulating film 15 are then patterned by photo lithography and etching to form contact holes 15a and 15b on the n-type source-drain regions 8a and 8b.

A glue film is subsequently formed in inner surfaces of the contact holes 15a and 15b and an upper surface of the first interlayer insulating film 15 by the sputtering method, and thereafter, a tungsten film is formed on the glue film by the CVD method to entirely embed the contact holes 15a and 15b with the tungsten film. As the glue film, a titanium film having a thickness of approximately 30 nm and a titanium nitride film having a thickness of approximately 20 nm are formed in this order, for example.

The redundant glue film and tungsten film on the first interlayer insulating film 15 are then polished by the CMP method and removed, and the glue film and the tungsten film in the contact holes 15a and 15b are left as contact plugs 13a and 13b.

The contact plugs 13a and 13b are electrically connected to the n-type source-drain regions 8a and 8b below the contact plugs 13a and 13b.

Since the contact plugs 13a and 13b formed in this manner contain tungsten, which is easily oxidized, as a main component, the contact plugs 13a and 13b are oxidized easily in an oxygen-containing atmosphere and tend to cause a contact failure.

Figure 1C:
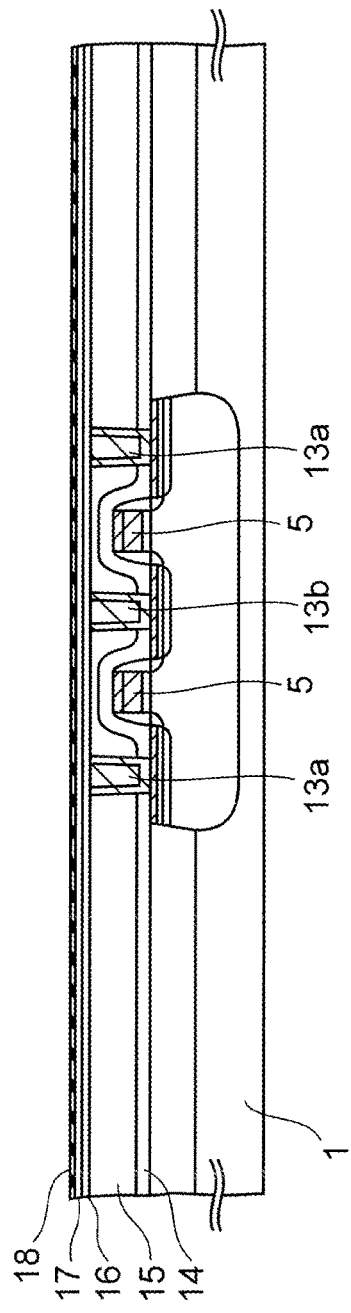

Accordingly, in the next step, as illustrated in FIG. 1C, a silicon oxy-nitride film is formed by the plasma CVD method as an oxidation prevention insulating film 16 which protects the abovementioned contact plugs 13a and 13b against the oxidation atmosphere. The silicon oxy-nitride film is formed on the first interlayer insulating film 15 and the contact plugs 13a and 13b, and has a thickness of approximately 100 nm.

A silicon oxide film is further formed as a first insulating adhesion film 17 with a thickness of approximately 130 nm on the oxidation prevention insulating film 16 by the plasma CVD method which uses TEOS gas.

Further, a silicon nitride film may be formed as the first insulating adhesion film 17, instead of the silicon oxide film.

The first insulating adhesion film 17 is thereafter subjected to annealing in a nitrogen atmosphere under conditions of the substrate temperature at 650° C. and the process time of 30 minutes so as to degas the first insulating adhesion film 17.

After this annealing is finished, an alumina film serving as a second insulating adhesion film 18 is then formed with a thickness of approximately 20 nm on the first insulating adhesion film 17 by the sputtering method.

Figure 1D:
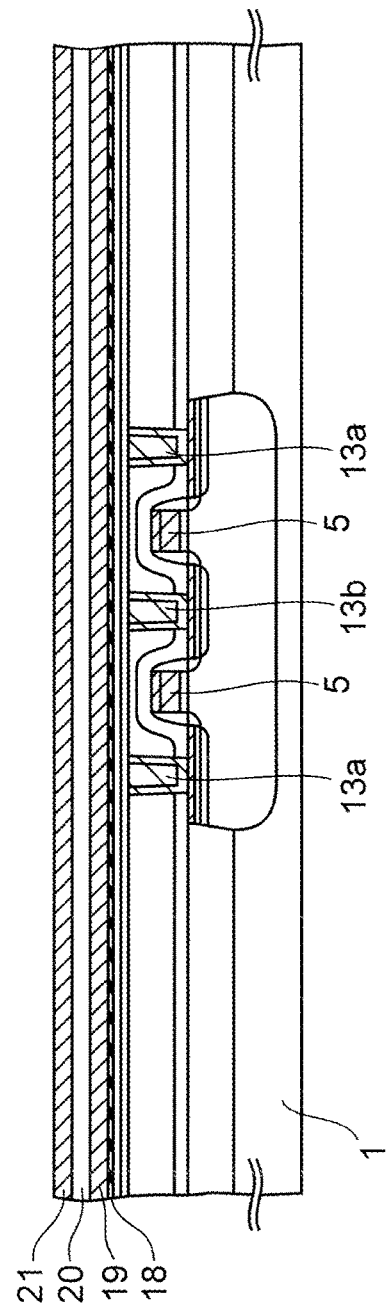

Next, steps for obtaining a structure illustrated in the cross-sectional view in FIG. 1D will be described.

Firstly, a noble metal film such as a platinum film is formed as a first conductive film 19 with a thickness in a range from 50 nm to 150 nm by the sputtering method.

The condition for forming the first conductive film 19 is not specially limited. In this example, the first conductive film 19 is formed by introducing argon gas as a sputtering gas into a film forming atmosphere under the pressure of approximately 1 Pa and by setting the input power to 0.3 kW while maintaining the substrate temperature at 350° C.

Instead of the platinum film, there may be formed a single layer film of any one of an iridium film, a ruthenium film, an iridium oxide ($IrO_2$) film, a ruthenium oxide ($RuO_2$) film, a platinum oxide ($PtO_x$) film, an $SrRuO_3$ film, and a LaSr-$CoO_3$ film, or a laminated film thereof.

A PZT film serving as a ferroelectric film 20 is then formed on the first conductive film 19. The lower and upper layers of the PZT film are formed separately. The lower layer is formed with a thickness in a range from approximately 30 nm to 150 nm, for example, 70 nm, by the sputtering method, and thereafter, is subjected to annealing in an oxygen-containing atmosphere to crystallize the PZT. Such annealing is also called crystallization annealing, and the crystallization annealing is carried out at the substrate temperature of approximately 620° C. and for the process time of approximately 90 seconds in the present embodiment. Thereafter, the upper layer of the PZT film is formed with a thickness in a range from 5 nm to 20 nm by the sputtering method.

In addition to the sputtering method, available film-forming methods of the ferroelectric film 20 include a metal organic CVD (MOCVD) method, a sol-gel method, a metal-organic decomposition (MOD) method, chemical solution deposition (CSD) method, the CVD method, and an epitaxial growth method.

In addition, the material of the ferroelectric film 20 is not limited to the abovementioned PZT; alternatively, any one of SBT (strontium bismuth tantalate: $SrBi_2Ta_2O_9$), BLT ((Bi, Nn)$_4$Ti$_2$O$_{12}$ (Ln=La, Nd, or Pr)), and BFO ($BiFeO_3$) may be used as the material of the ferroelectric film 20.

An iridium oxide ($IrO_2$) film is thereafter formed as a second conductive film 21 with a thickness in a range from 90 nm to 250 nm on the ferroelectric film 20 by the sputtering method. The second conductive film 21 is preferably a noble metal film or an oxidation noble metal film, and a noble metal film such as an iridium film or a platinum film may be formed as the second conductive film 21 instead of the abovementioned iridium oxide film.

In addition, an iridium oxide film having a two-layer structure may be formed as the second conductive film 21. In this case, the film thickness of the first layer of the iridium oxide is, for example, 20 nm to 50 nm, and the film thickness of the second layer of the iridium oxide film is, for example 70 nm to 200 nm.

The subsequent steps will be described with reference to FIG. 2A to FIG. 2J.

FIG. 2A to FIG. 2J are enlarged cross-sectional views of a ferroelectric capacitor in the course of manufacture included in the semiconductor device which the present inventors study.

A FeRAM of a planar type includes a plurality of upper electrodes at intervals on a stripe-shaped ferroelectric film, which is described later. In FIG. 2A to FIG. 2J, a first cross section is a cross section which includes no upper electrode, and a second cross section is a cross section which includes the upper electrode.

FIG. 3A to FIG. 3H are enlarged plan views of the ferroelectric capacitor in the course of manufacture included in the semiconductor device which the present inventors study.

Figure 2A:
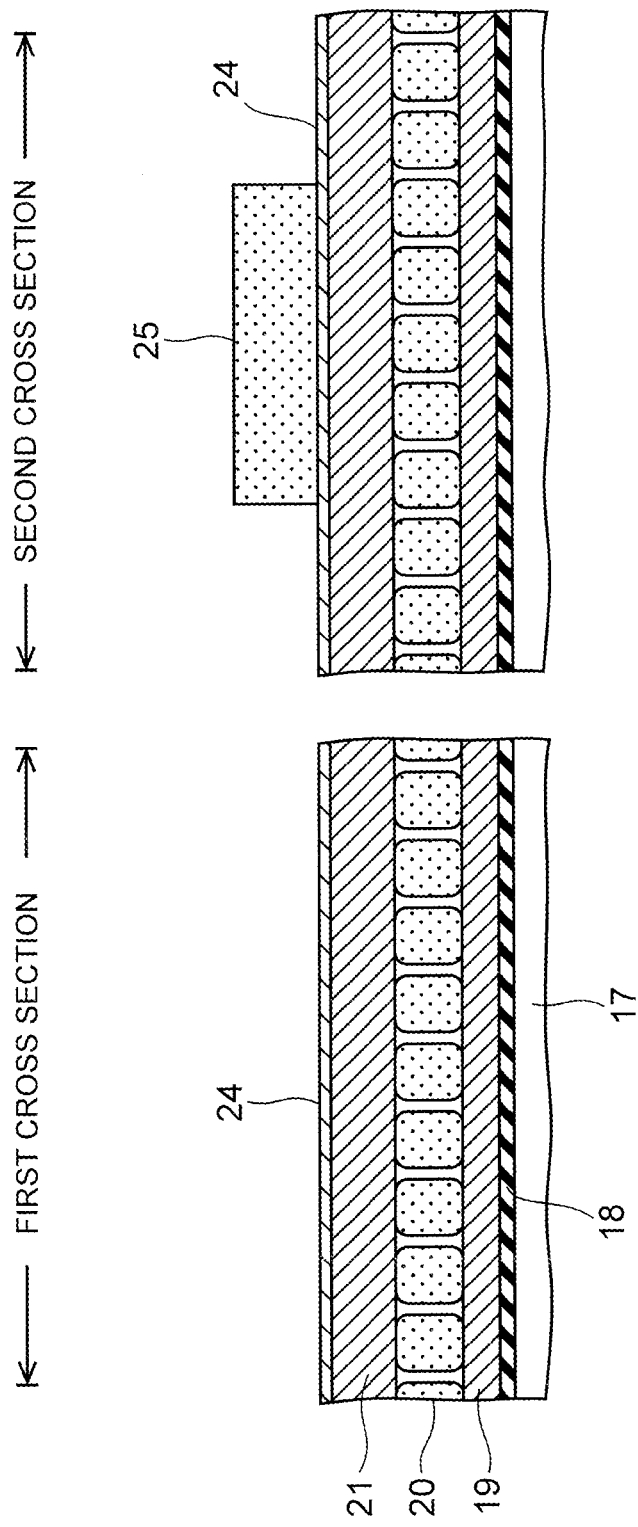

Firstly, as illustrated in FIG. 2A, a titanium nitride film serving as a hard mask 24 is formed with a thickness of approximately 34 nm on the second conductive film 21 by the sputtering method.

The hard mask 24 is not specially limited as long as the etching rate of a film is lower than that of the resist. For example, instead of the titanium nitride film, another type of film may be formed as the hard mask 24, such as a TiON film, a $TiO_x$ film, a $TaO_x$ film, a TaON film, a $TiAlO_x$ film, a $TaAlO_x$ film, a TiAlON film, a TaAlON film, a TiSiON film, a TaSiON film, a $TiSiO_x$ film, a $TaSiO_x$ film, an $AlO_x$ film, and a $ZrO_x$ film.

A photoresist is further applied onto the hard mask 24, and the applied photoresist is exposed and developed to form a first resist film 25 having a shape of a capacitor upper electrode.

Figure 3A:
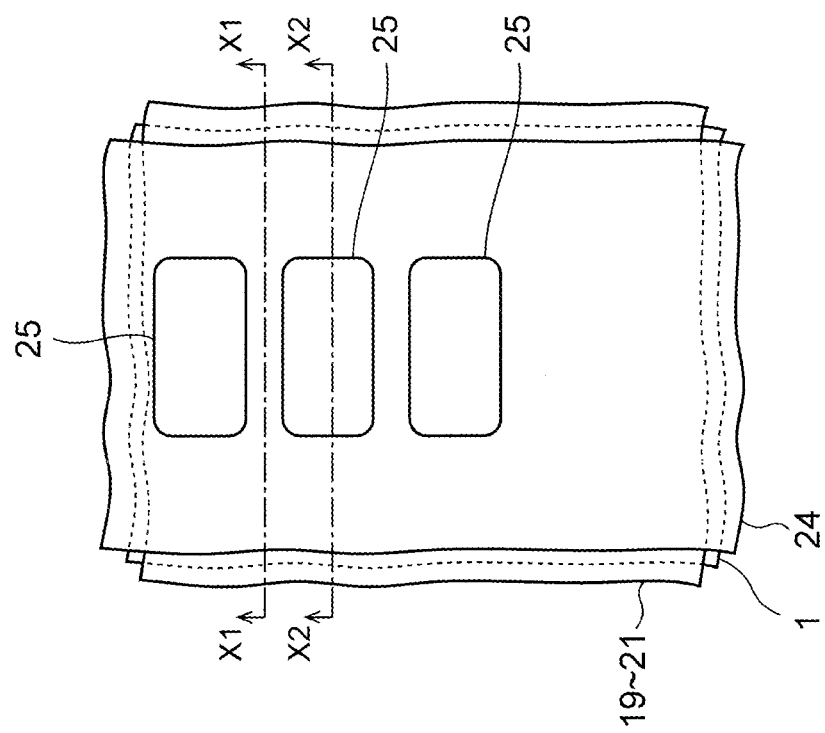
FIG. 3A to FIG. 3H are enlarged plan views of the ferroelectric capacitor in the course of manufacture included in the semiconductor device which the present inventors study.

FIG. 3A is an enlarged plan view after the completion of this step, and the first cross section and the second cross section in FIG. 2A described above correspond to a cross section cut along the X1-X1 line and a cross section cut along the X2-X2 line in FIG. 3A, respectively.

As illustrated in FIG. 3A, the first resist film 25 has an island shape in plan view, and a plurality of the first resist films 25 are formed at intervals on the hard mask 24.

Figure 2B:
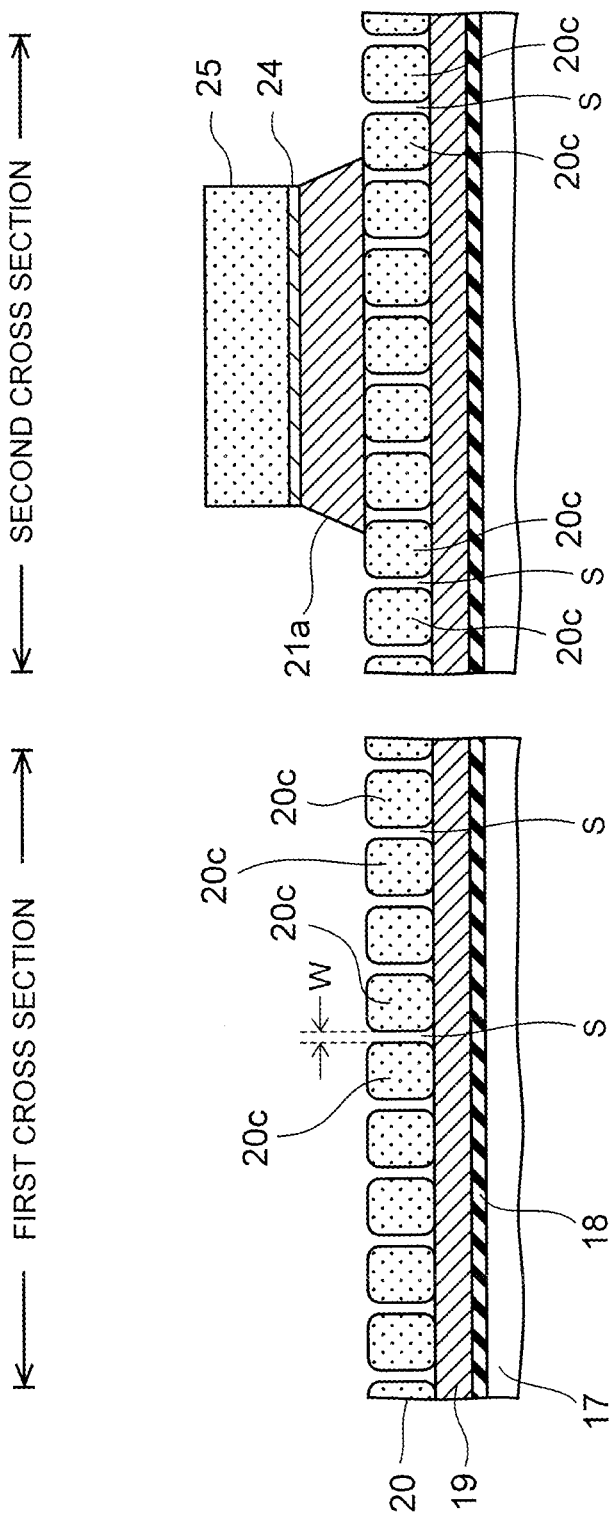

As illustrated in FIG. 2B, the hard mask 24 is then dry etched using the first resist film 25 as a mask, so that the hard mask 24 is patterned to a shape of the capacitor upper electrode.

The dry etching is carried out within an inductively coupled plasma (ICP) etching chamber, which is not illustrated, and a mixed gas of chlorine gas and argon gas serving as an etching gas is supplied into the chamber.

The second conductive film 21 is further dry etched using the hard mask 24 and the first resist film 25 as a mask while successively using the abovementioned ICP etching chamber to form an upper electrode 21a.

The mixed gas of chlorine gas and argon gas is used as for an etching gas of the dry etching, similar to a case where the hard mask 24 is etched.

Moreover, the second conductive film 21 is dry etched in this manner to expose the ferroelectric film 20 at the sides of the upper electrode 21a.

The ferroelectric film 20 includes a plurality of crystal grains 20c, and a gap S having a width W of about several nm is generated along each grain boundary between the crystal grains 20c.

It may be considered that the gap S is formed regardless of the film-forming method of the ferroelectric film 20. As in the present example, the ferroelectric material in the ferroelectric film 20 formed by the sputtering method is contracted by the foregoing crystallization annealing which is carried out after the formation of the ferroelectric film 20, which particularly generates the gaps S.

Thereafter, the first resist film 25 is removed by ashing. The hard mask 24 is removed by dry etching.

Figure 3B:
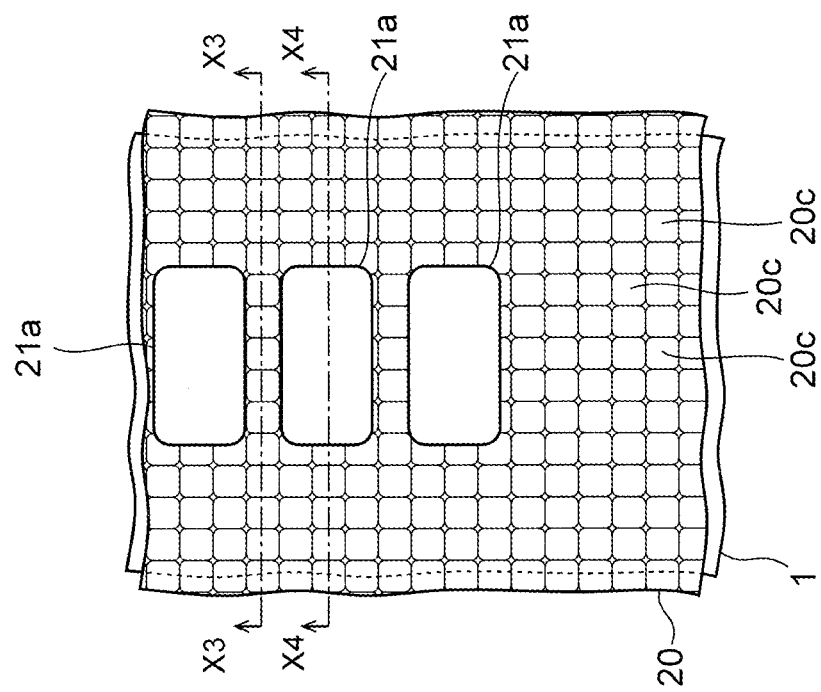

FIG. 3B is an enlarged plan view after the completion of this step, and the first cross section and the second cross section in FIG. 2B described above correspond to a cross section cut along the X3-X3 line and a cross section cut along the X4-X4 line in FIG. 3B, respectively.

As illustrated in FIG. 3B, the upper electrode 21a has an island shape in plan view, and a plurality of the upper electrodes 21a are formed at intervals on the ferroelectric film 20.

As illustrated in FIG. 2C, a photoresist is subsequently applied onto the entire upper surface of the ferroelectric film 20, and the applied photoresist is exposed and developed to form a second resist film 26 having a shape of a capacitor dielectric film.

Figure 3C:
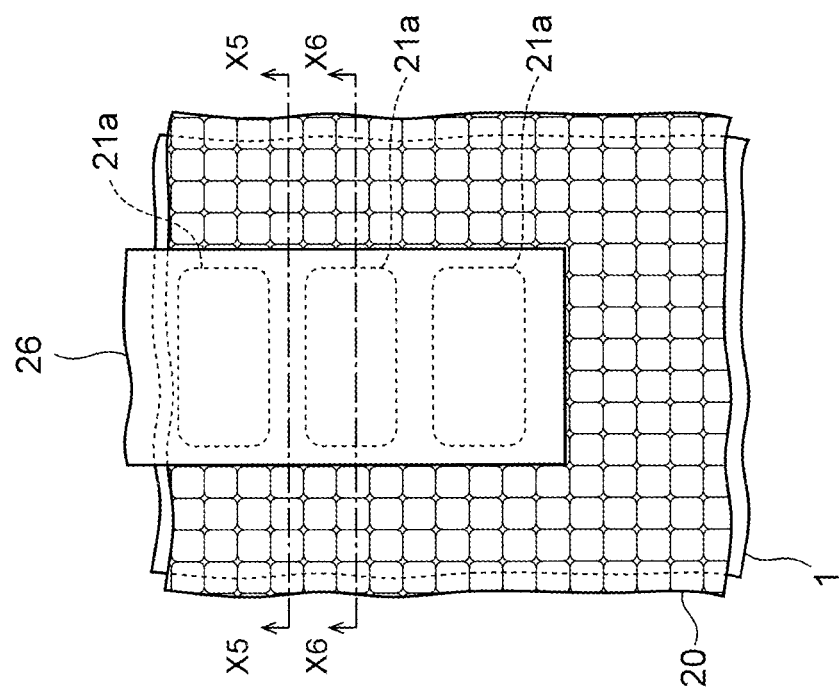

FIG. 3C is an enlarged plan view after the completion of this step, and the first cross section and the second cross section in FIG. 2C described above correspond to a cross section cut along the X5-X5 line and a cross section cut along the X6-X6 line in FIG. 3C, respectively.

As illustrated in FIG. 3C, the second resist film 26 has a stripe shape in plan view, and the plurality of the upper electrodes 21a are covered with the second resist film 26.

Figure 2D:
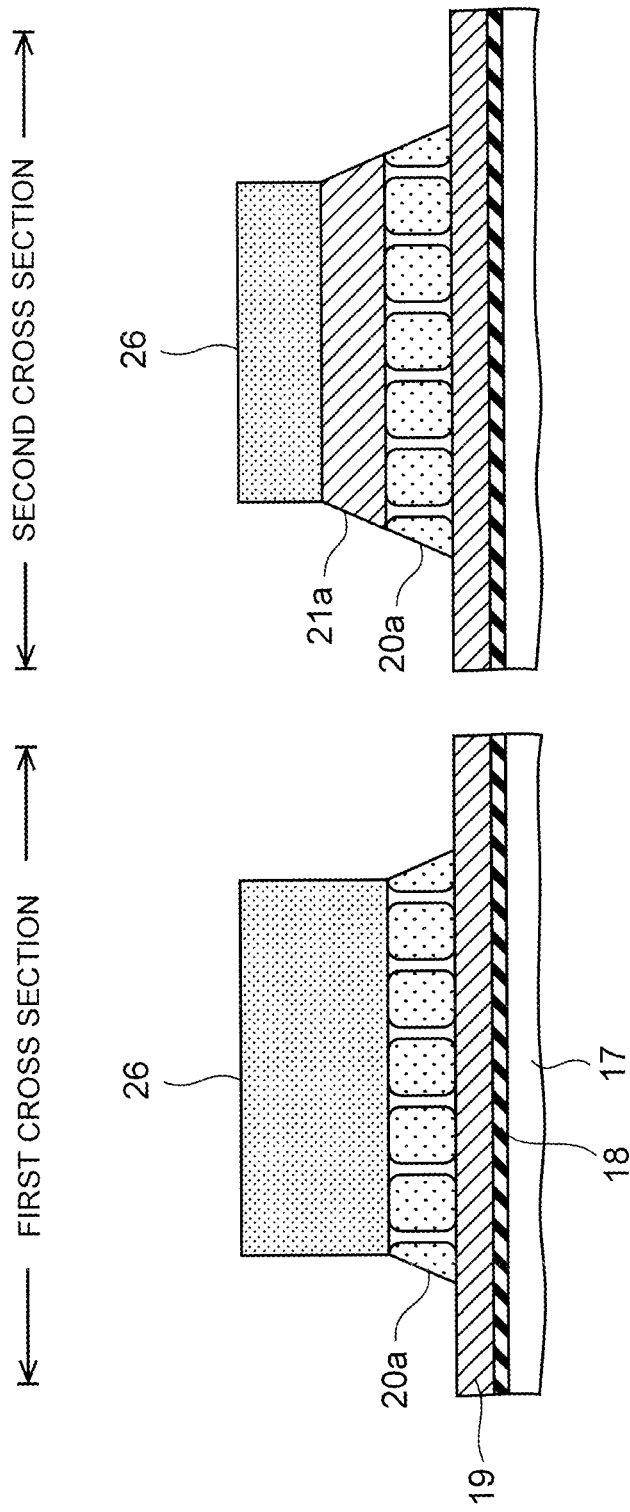

As illustrated in FIG. 2D, the ferroelectric film 20 is subsequently dry etched using the second resist film 26 as a mask, and the remaining ferroelectric film 20 is used as a capacitor dielectric film 20a.

In the dry etching, for example, a mixed gas of chlorine gas and argon gas is used as an etching gas.

Thereafter, the second resist film 26 is removed by ashing.

After the second resist film 26 has been removed, annealing in an oxygen-containing atmosphere may be carried out for the capacitor dielectric film 20a to recover from a damage which the capacitor dielectric film 20a has received in the foregoing steps. Such annealing is also called recovery annealing.

The recovery annealing may be carried out under conditions of the substrate temperature at 600° C. to 700° C. for approximately 40 minutes, for example.

Figure 3D:
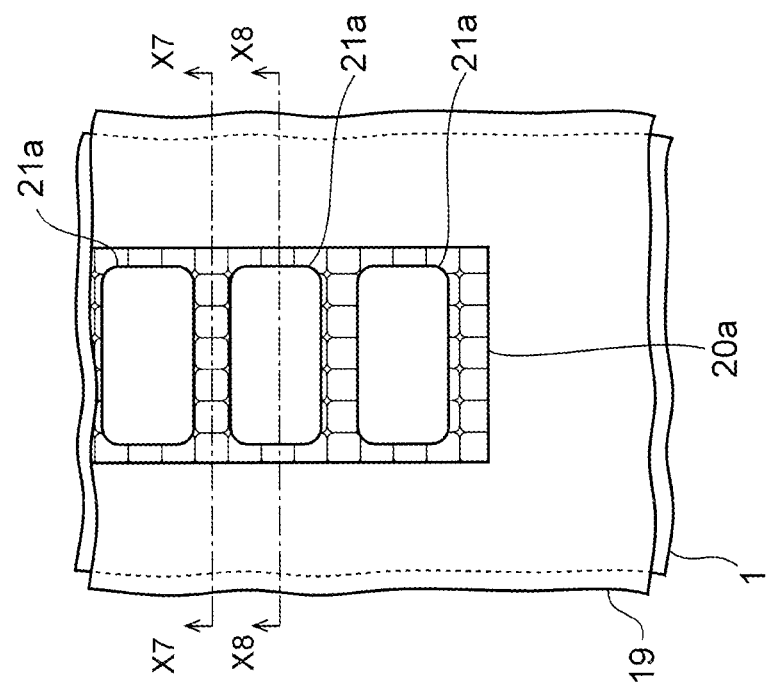

FIG. 3D is an enlarged plan view after the completion of this step, and the first cross section and the second cross section in FIG. 2D described above correspond to a cross section cut along the X7-X7 line and a cross section cut along the X8-X8 line in FIG. 3D, respectively.

As illustrated in FIG. 3D, the plurality of the upper electrodes 21a are formed at intervals on the capacitor dielectric film 20a having a stripe shape in plan view.

Figure 2E:
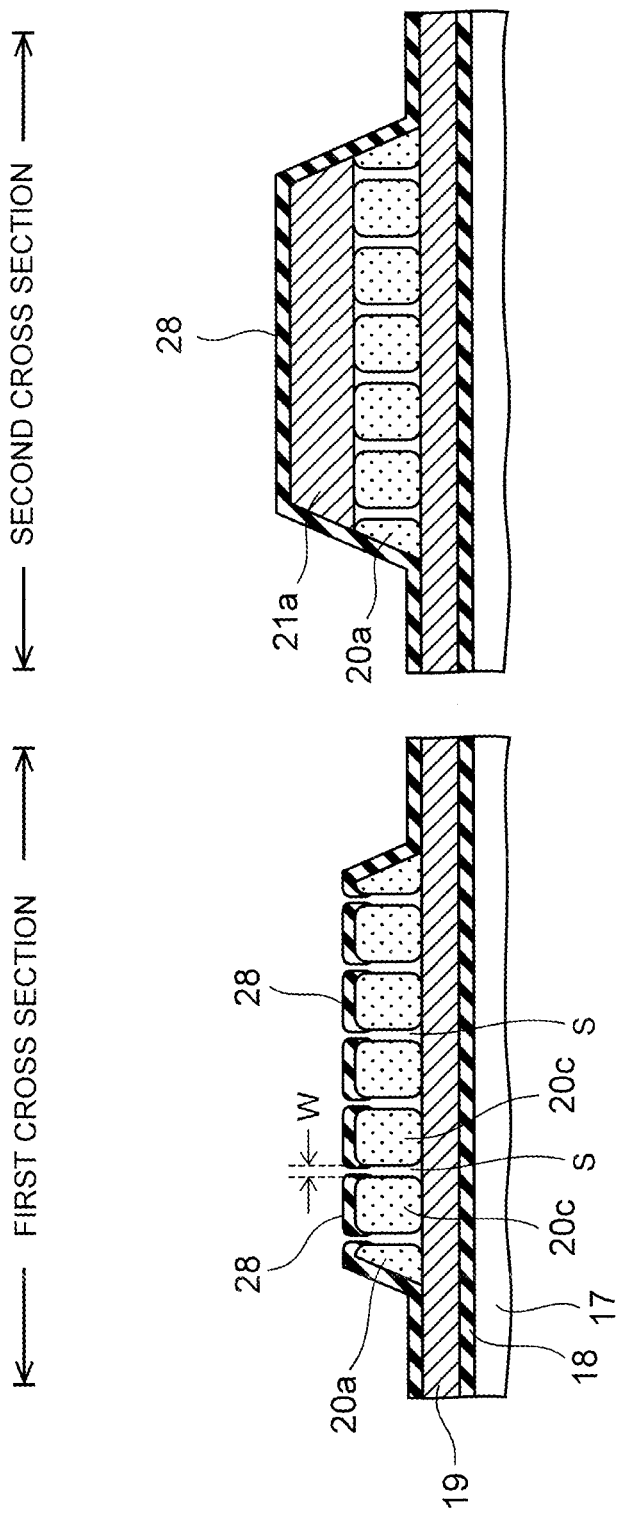

As illustrated in FIG. 2E, an alumina film is then formed with a thickness of 50 nm by the sputtering method as a first protective insulating film 28 for protecting the capacitor dielectric film 20a against the reducing atmosphere such as hydrogen.

Here, the first protective insulating film 28 formed by the sputtering method has a poor step coverage property. Accordingly, as illustrated in the first cross section, the gaps S between the crystal grains 20c are not filled with the first protective insulating film 28 but remain exposed.

Although the width W of the gap S is about several nm as described above, it becomes apparent that the gaps S are difficult to be filled with the first protective insulating film 28 by the sputtering method, even if the thickness of the first protective insulating film 28 is considerably larger than the width W.

It may be also thought that the alumina film is formed by an atomic layer deposition (ALD) method having a step coverage property more excellent than the sputtering method so as to fill the gaps S.

However, a raw material gas used in the ALD method for forming the alumina film contains hydrogen, which reduces and deteriorates the capacitor dielectric film 20a. Examples of such a raw material gas containing hydrogen include trimethyl aluminum (TMA), aluminum tri-sec-butoxide (Al (O-sec-$C_4H_9$)$_3$), and aluminum tri-iso-propoxide (Al(O-i-$C_3H_7$)$_3$).

In this example, the capacitor dielectric film 20a is formed by the sputtering method which uses a gas including argon and excluding hydrogen as a sputtering gas so as to prevent the raw material gas containing hydrogen from deteriorating the capacitor dielectric film 20a.

Figure 3E:
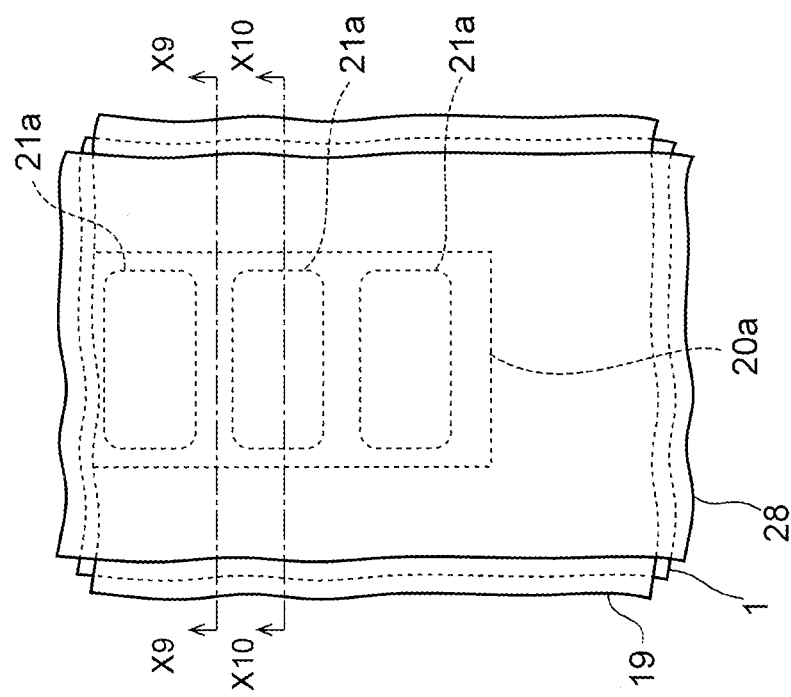

FIG. 3E is an enlarged plan view after the completion of this step, and the first cross section and the second cross section in FIG. 2E described above correspond to a cross section cut along the X9-X9 line and a cross section cut along the X10-X10 line in FIG. 3E, respectively.

Figure 2F:
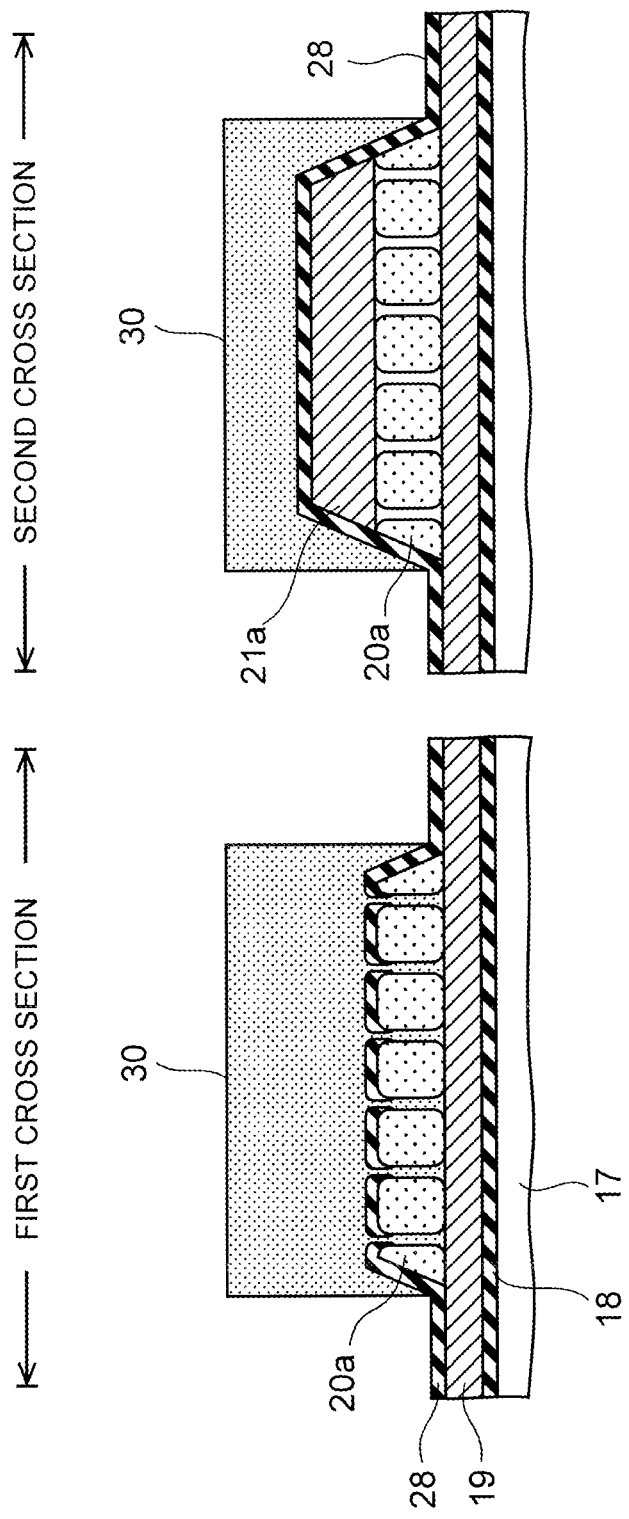

As illustrated in FIG. 2F, a photoresist is subsequently applied onto the first protective insulating film 28, and the applied photoresist is exposed and developed to form a third resist film 30 having a shape of a capacitor lower electrode.

Figure 3F:
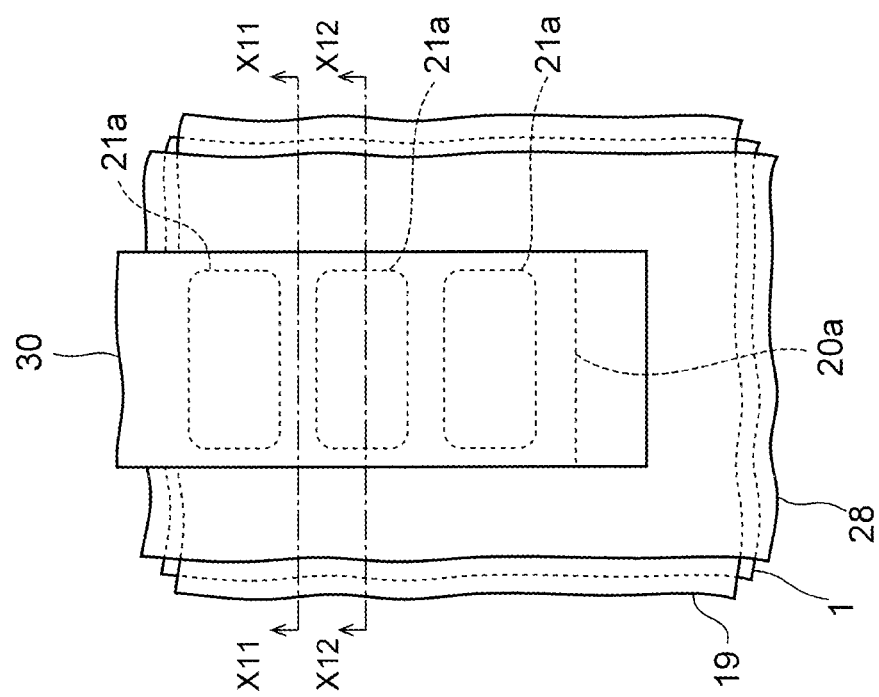

FIG. 3F is an enlarged plan view after the completion of this step, and the first cross section and the second cross section in FIG. 2F described above correspond to a cross section cut along the X11-X11 line and a cross section cut along the X12-X12 line in FIG. 3F, respectively.

As illustrated in FIG. 3F, the third resist film 30 has a stripe shape in plan view, and the capacitor dielectric film 20a and each of the upper electrodes 21a are covered with the third resist film 30.

As illustrated in FIG. 2G, the first protective insulating film 28 and the first conductive film 19 are then dry etched using the third resist film 30 as a mask, and the remaining first conductive film 19 is used as a lower electrode 19a.

Moreover, this etching removes portions of the second insulating adhesion film 18 which are not covered with the lower electrode 19a.

An example of the etching gas used in this etching includes a halogen gas capable of etching platinum group elements such as platinum included in the first conductive film 19. In this example, a chlorine gas is used as the halogen gas, and a mixed gas of argon gas and chlorine gas is used as an etching gas. The etching gas also etches the third resist film 30, causing the side surfaces of the third resist film 30 to recede, and thereby exposing the gaps S of the capacitor dielectric film 20.

In this step, the metals such as the platinum included in the first conductive film 19 and the aluminum included in the first protective insulating film 28 are released in an etching atmosphere. Further, a product R containing these metals and chlorine in the etching gas is generated, and the products R enter the gaps S.

Figure 3G:
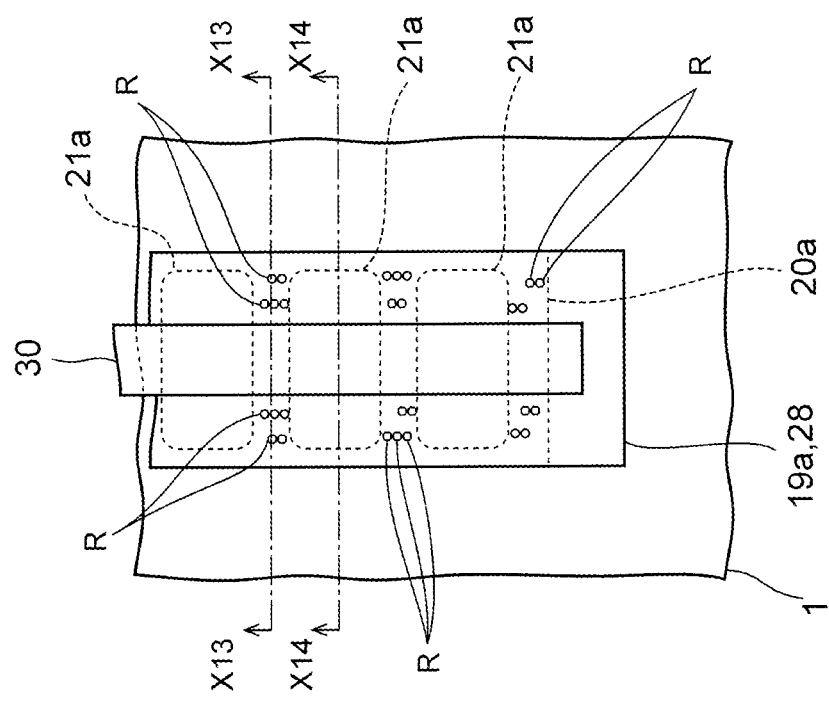

FIG. 3G is an enlarged plan view after the completion of this step, and the first cross section and the second cross section in FIG. 2G described above correspond to a cross section cut along the X13-X13 line and a cross section cut along the X14-X14 line in FIG. 3G, respectively.

As illustrated in FIG. 3G, the abovementioned products R are localized in the regions between the upper electrodes 21a in this stage, and no product R is present under the upper electrodes 21a.

As illustrated in FIG. 2H, the third resist film 30 is then removed by ashing.

A wet process may be carried out after this ashing so as to remove the residue of the third resist film 30. However, as described above, the products R containing the metals such as aluminum and platinum are not completely removed by the wet process and remain in the gaps S.

With the foregoing steps, a ferroelectric capacitor Q is formed in which the lower electrode 19a, the capacitor dielectric film 20a, and the upper electrodes 21a are stacked in this order.

There is a possibility that the capacitor dielectric film 20a may be deteriorated due to the reducing substance such as hydrogen because the upper electrodes 21a of the ferroelectric capacitor Q are protected by the first protective insulating film 28 but the first protective insulating film 28 is not formed on the side surfaces of the ferroelectric capacitor Q.

Figure 2I:
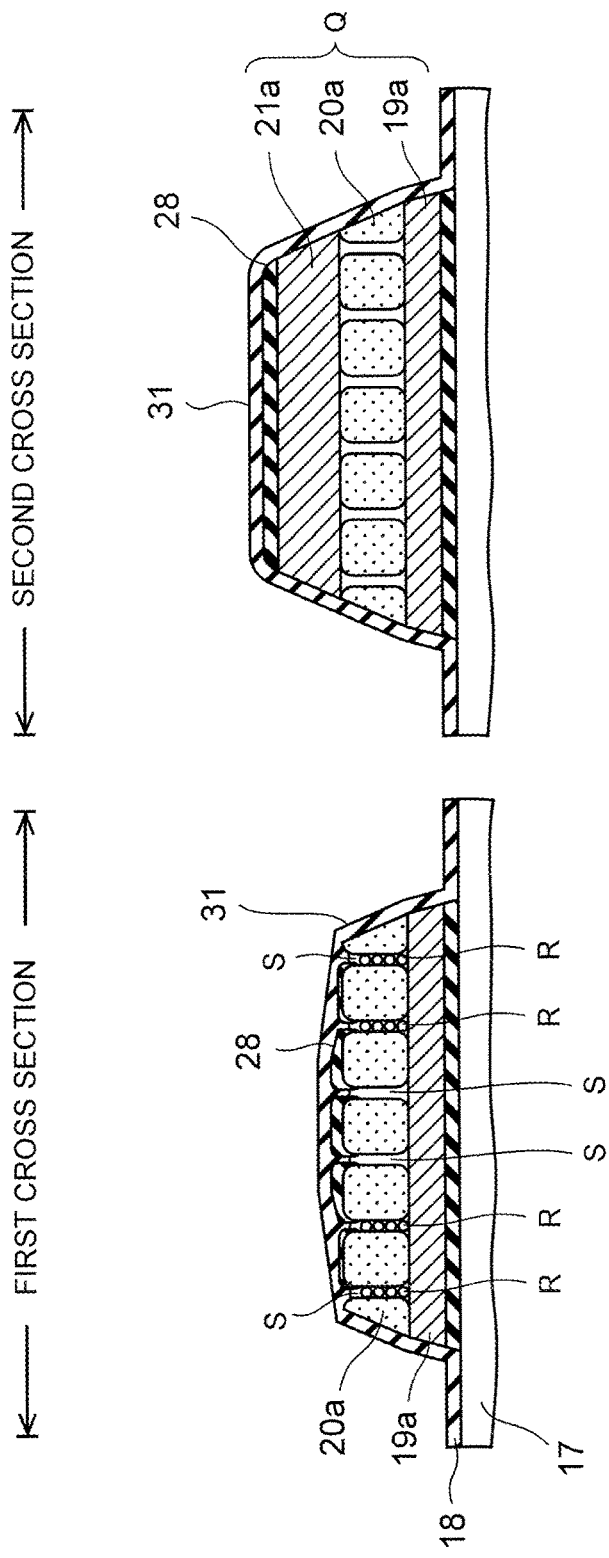

Therefore, in the next step, as illustrated in FIG. 2I, an alumina film serving as a second protective insulating film 31 is again formed on the ferroelectric capacitor Q to prevent the reducing substance from penetrating into the capacitor dielectric film 20a.

As described above, forming the second protective insulating film 31 by the sputtering method having a poor step coverage property does not fill the gaps S of the capacitor dielectric film 20a with the second protective insulating film 31 in a region where no upper electrode 21a is present as with the first cross section.

Therefore, in this example, the second protective insulating film 31 is formed by the ALD method excellent in the step coverage property to fill the gaps S, thereby preventing the reducing substance from penetrating into the capacitor dielectric film 20a through the gaps S from the outside atmosphere.

The first protective insulating film 28 has been formed on an upper surface of the capacitor dielectric film 20a in this stage, so that a small portion of the surface of the capacitor dielectric film 20a is in direct contact with the raw material gas used in the ALD method. Therefore, even when a raw material gas containing hydrogen such as TMA is used, the capacitor dielectric film 20a is less likely to be deteriorated by hydrogen when the second protective insulating film 31 is formed.

The thickness of the second protective insulating film 31 is large enough to fill the gaps S, and is about 30 nm to 40 nm, for example.

The second protective insulating film 31 covering the ferroelectric capacitor Q in this manner blocks the escape routes of the products R described above and confines them in the gaps S.

Figure 2J:
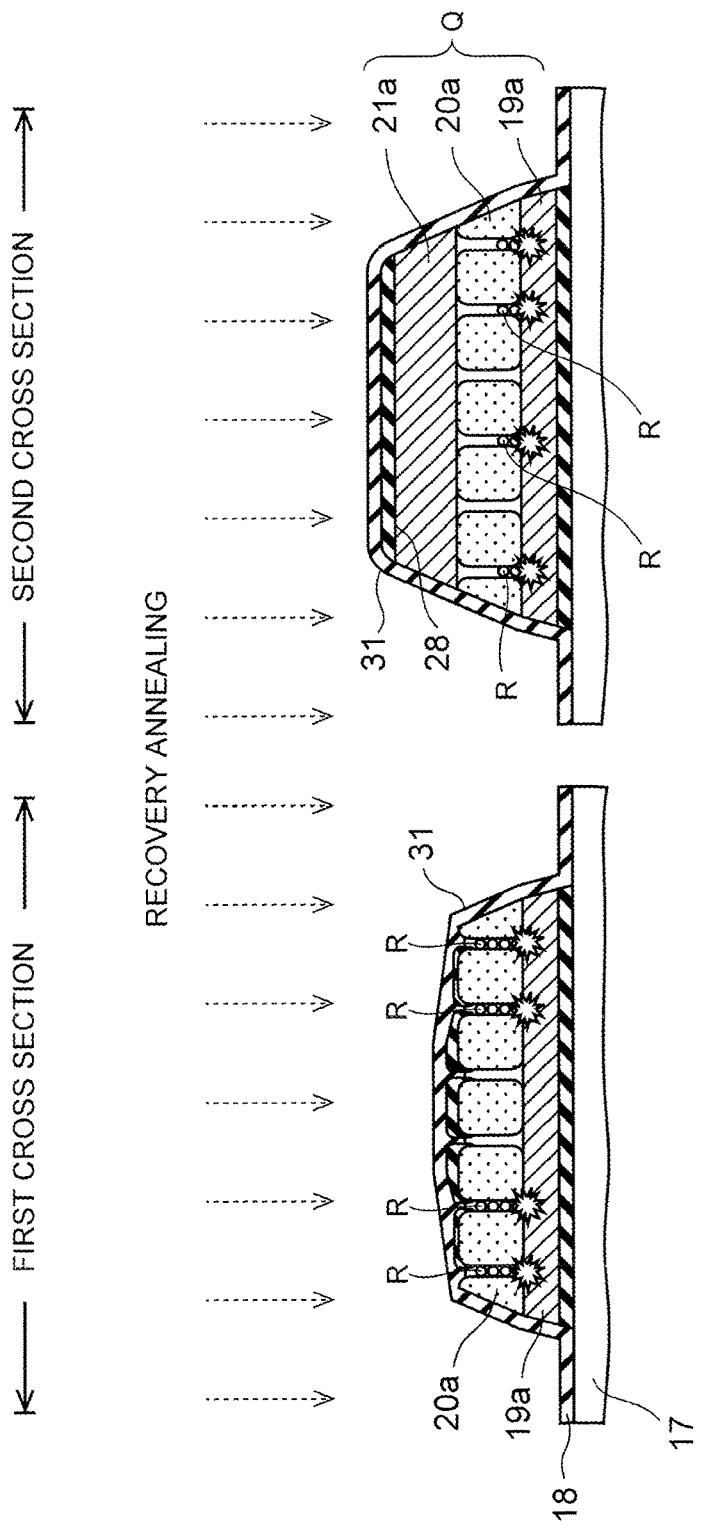

As illustrated in FIG. 2J, the recovery annealing is then carried out in an oxygen-containing atmosphere for the capacitor dielectric film 20a to recover from the damage which the capacitor dielectric film 20a has received in the foregoing steps.

The recovery annealing is carried out, for example, in an atmosphere of oxygen 100% under conditions of the substrate temperature at 650° C. and the process time of about 40 minutes.

Figure 3H:
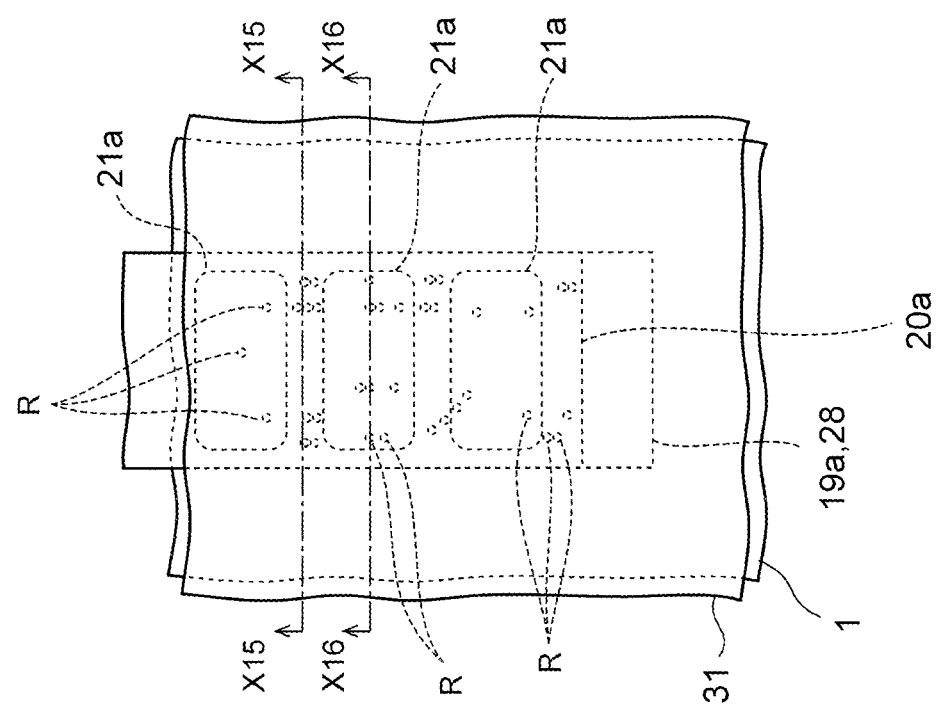

FIG. 3H is an enlarged plan view after the completion of this step, and the first cross section and the second cross section in FIG. 2J described above correspond to a cross section cut along the X15-X15 line and a cross section cut along the X16-X16 line in FIG. 3H, respectively.

With the foregoing steps, the process to the ferroelectric capacitor Q is finished.

Herein, before the recovery annealing in FIG. 2J, although the products R described above are localized in regions where no upper electrode 21a is present like the first cross section, the heat of the recovery annealing diffuses the products R along the gaps S. As a result, the products R are also diffused to the regions where the upper electrodes 21a are present like the second cross section.

It becomes apparent that the chlorine, which the products R contain as described above, corrodes the lower electrode 19a due to the heat in the recovery annealing.

It may be considered that the corrosion of the lower electrode 19a specially in a region where the upper electrode 21a are present as with the second cross section deteriorates the electrical characteristics of the ferroelectric capacitor Q including the upper electrodes 21 and the lower electrode 19a.

The present inventors make various examinations how the ferroelectric capacitor Q is deteriorated by such corrosion in the lower electrode 19a.

These examinations will be described below.

The present inventors firstly confirm whether the gaps S are actually formed in the ferroelectric film 20.

Figure 4:
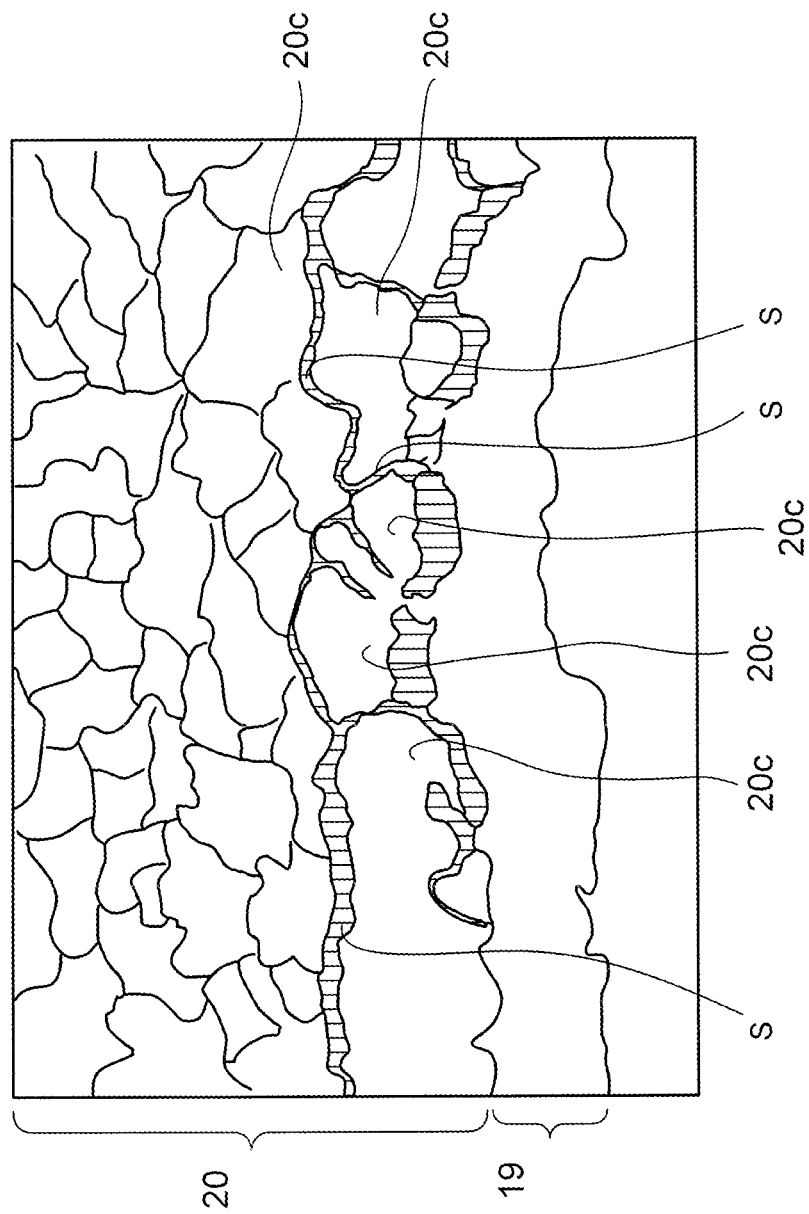
FIG. 4 is a perspective view drawn based on a scanning electron microscope (SEM) image of the ferroelectric film.

FIG. 4 is a perspective view drawn based on a scanning electron microscope (SEM) image of the ferroelectric film 20.

Note that, the SEM image is acquired immediately after the crystallization annealing is carried out for the ferroelectric film 20.

As illustrated in FIG. 4, it is confirmed that the gaps S along the grain boundaries are generated in the ferroelectric film 20. It may be considered that the gaps S are generated by the contraction of the ferroelectric film 20 caused by the crystallization annealing as described above.

Figure 5:
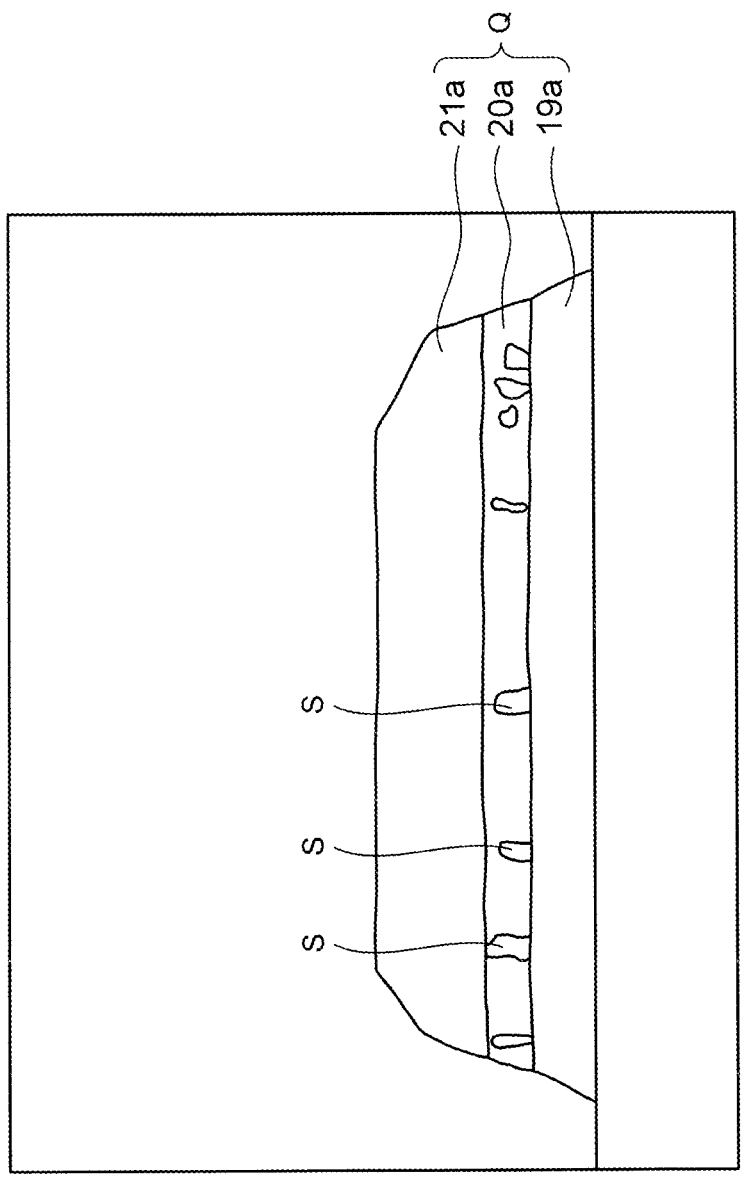
FIG. 5 is a cross-sectional view drawn based on a transmission electron microscope (TEM) image of the ferroelectric capacitor.

Meanwhile, FIG. 5 is a cross-sectional view drawn based on a transmission electron microscope (TEM) image of the ferroelectric capacitor Q.

As illustrated in FIG. 5, it may be understood that the gaps S are generated in the capacitor dielectric film 20a also in the TEM image.

Figure 6:
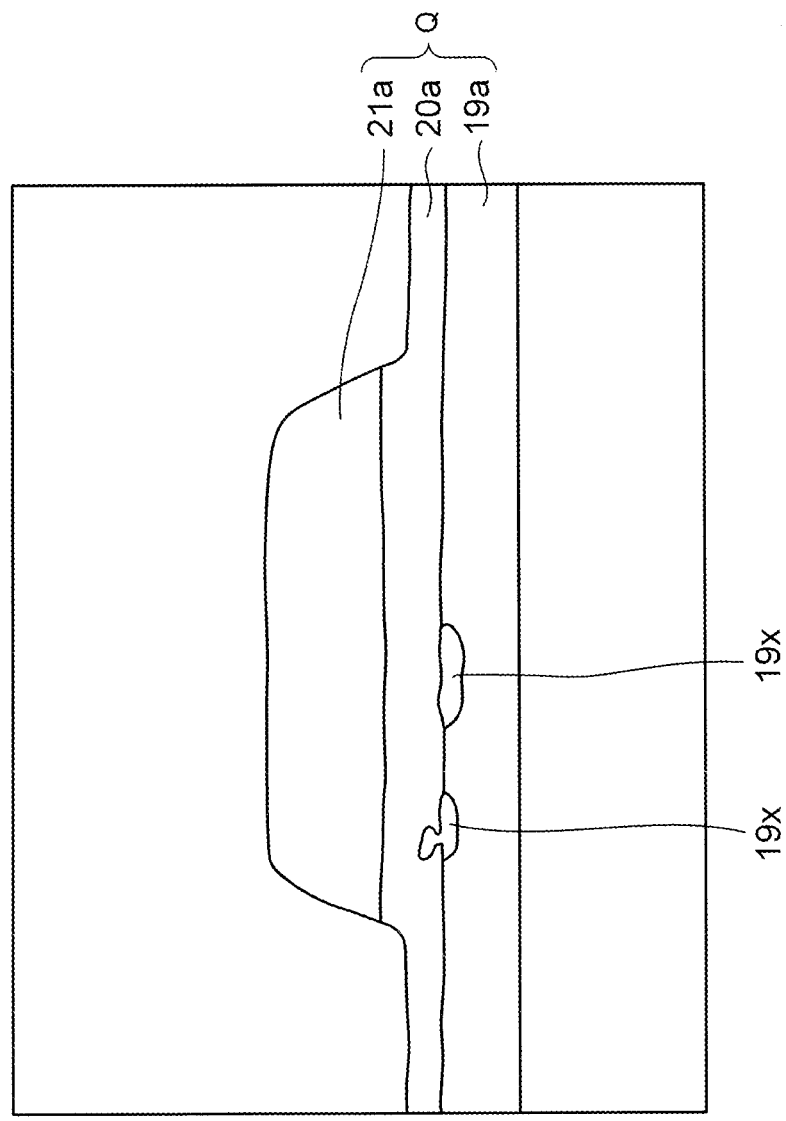
FIG. 6 is a cross-sectional view drawn based on an SEM image of the ferroelectric capacitor different from that of FIG. 5.

Moreover, FIG. 6 is a cross-sectional view drawn based on an SEM image of a ferroelectric capacitor Q different from that of FIG. 5.

As illustrated in FIG. 6, recesses 19x are formed in the lower electrode 19a of the ferroelectric capacitor Q. It may be considered that the recesses 19x are formed due to the corrosion by the products R as described above.

Figure 7:
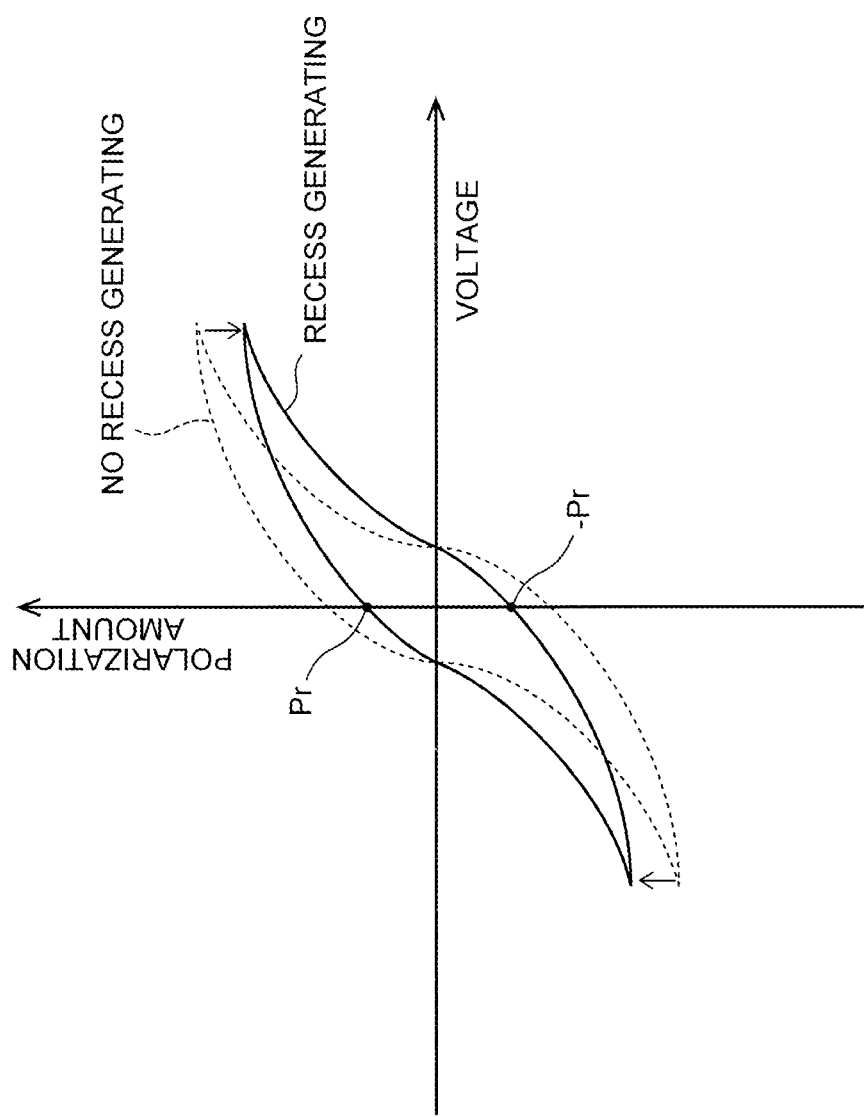
FIG. 7 is a schematic diagram illustrating a hysteresis curve of the ferroelectric capacitor in which recesses are generated in a lower electrode.

FIG. 7 is a schematic diagram illustrating a hysteresis curve of the ferroelectric capacitor Q in which the recesses 19x are generated as described above. The horizontal axis indicates the voltage applied between the upper electrode 21a and the lower electrode 19a and the vertical axis indicates the polarization amount of the capacitor dielectric film 20a.

In FIG. 7, the hysteresis curve of a normal ferroelectric capacitor Q having no recess 19x is illustrated by dashed lines, and the hysteresis curve of a ferroelectric capacitor Q in which the recesses 19x are generated is illustrated by solid lines.

A residual polarization charge amount Pr is a point where the hysteresis curve intersects the vertical axis, and it becomes apparent that the generation of the recesses 19x as the above lowers the residual polarization charge amount Pr compared with a case where no recess 19x is present.

It may be considered that such lowering in the residual polarization charge amount Pr becomes apparent when the miniaturization of the ferroelectric capacitor Q progresses and the rate which the recesses 19x occupy in the lower electrode 19a increases.

In addition, the lowering in the residual polarization charge amount Pr makes it difficult to read out information from the ferroelectric capacitor Q, thereby lowering yield of the semiconductor device.

Hereinafter, a present embodiment capable of reducing the generation of the recesses 19x and improving yield will be described.

Present Embodiment

In the present embodiment, a FeRAM of a planar type as a semiconductor device is manufactured as follows.

FIG. 8A to FIG. 8G are enlarged cross-sectional views of a ferroelectric capacitor in the course of manufacture included in a semiconductor device according to the present embodiment.

Note that, in FIG. 8A to FIG. 8G, the same elements explained in FIG. 1A to FIG. 1D, FIG. 2A to FIG. 2J, and FIG. 3A to FIG. 3H are assigned with the same reference numerals, and explanations thereof are omitted hereinafter.

As described above, the FeRAM of a planar type includes a plurality of upper electrodes at intervals provided on the stripe-shaped ferroelectric film, and in FIG. 8A to FIG. 8G, a first cross section is a cross section which includes no upper electrode, and a second cross section is a cross section which includes the upper electrodes.

Moreover, FIG. 10A to FIG. 10G are enlarged plan views of the ferroelectric capacitor in the course of manufacture included in the semiconductor device according to the present embodiment.

Figure 8A:
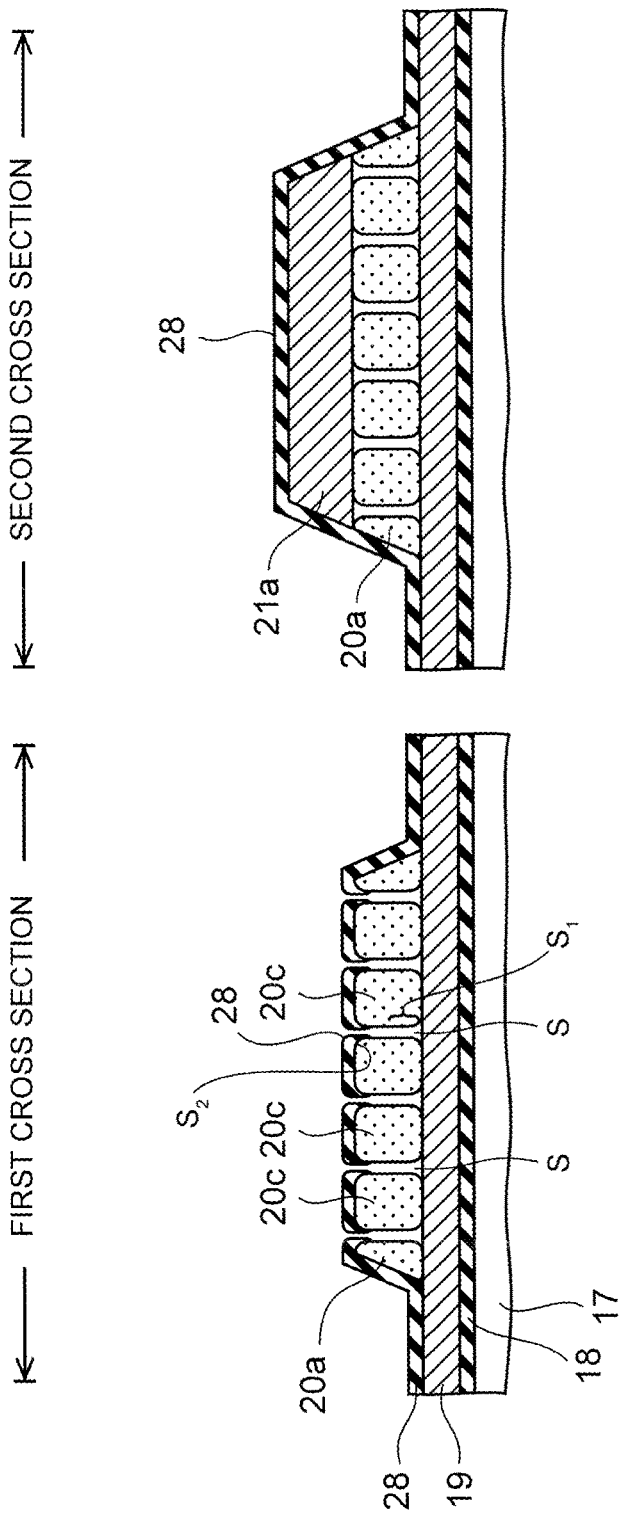
FIG. 8A to FIG. 8G are enlarged cross-sectional views of a ferroelectric capacitor in the course of manufacture included in a semiconductor device according to a present embodiment.

Firstly, the abovementioned steps of FIG. 1A to FIG. 1D and FIG. 2A to FIG. 2E are carried out to obtain a state where the capacitor dielectric film 20a and the upper electrodes 21a are covered with the first protective insulating film 28, as illustrated in FIG. 8A.

The first protective insulating film 28 is an alumina film formed by the sputtering method as has been explained with reference to FIG. 2E.

The first protective insulating film 28 formed by the sputtering method has a poor step coverage property as described above, so that the gaps S generated in the crystal grain boundaries of the capacitor dielectric film 20a are not filled with the first protective insulating film 28 but remain exposed.

Moreover, due to the poor step coverage property, the first protective insulating film 28 is formed to overhang an opening end $S_2$ at an upper portion of the gap S, and the first protective insulating film 28 is not formed at a lower portion $S_1$ of the gap S.

The film thickness of the first protective insulating film 28 is not specially limited, and is set in a range from 10 nm to 100 nm herein. The lower limit of the film thickness is set to 10 nm because if the first protective insulating film 28 is thinner than 10 nm, its ability of preventing hydrogen from passing therethrough may deteriorate and it does not protect the capacitor dielectric film 20a against the reducing substance such as hydrogen. The upper limit of the film thickness is set to 100 nm because if the first protective insulating film 28 is thicker than 100 nm, it would be difficult for oxygen to pass through the first protective insulating film 28 in each recovery annealing, which is described later, and this would make it difficult for the capacitor dielectric film 20a to recover from the damage with the oxygen in the annealing atmosphere.

Figure 10A:
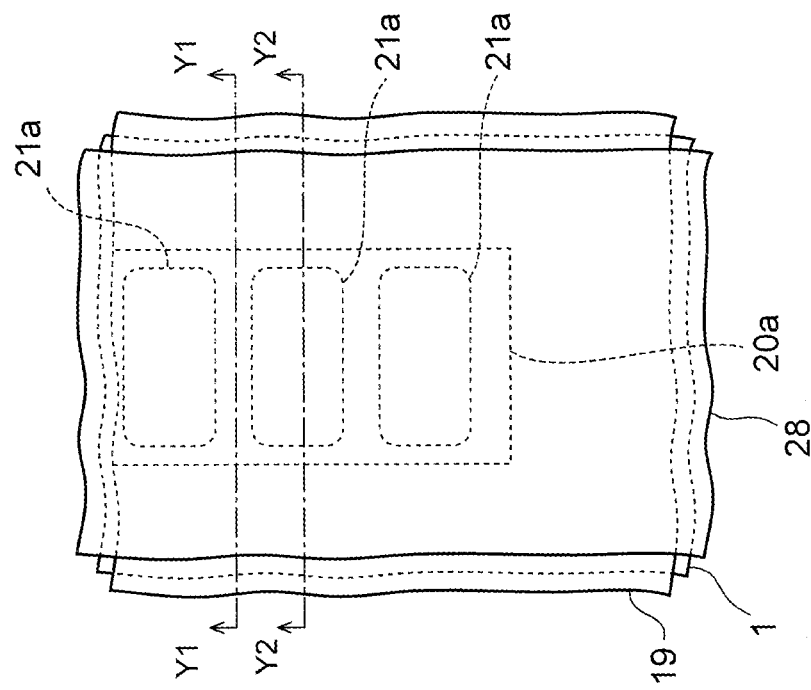

FIG. 10A is an enlarged plan view after the completion of this step, and the first cross section and the second cross section in FIG. 8A described above correspond to a cross section cut along the Y1-Y1 line and a cross section cut along the Y2-Y2 line in FIG. 10A, respectively.

Figure 8B:
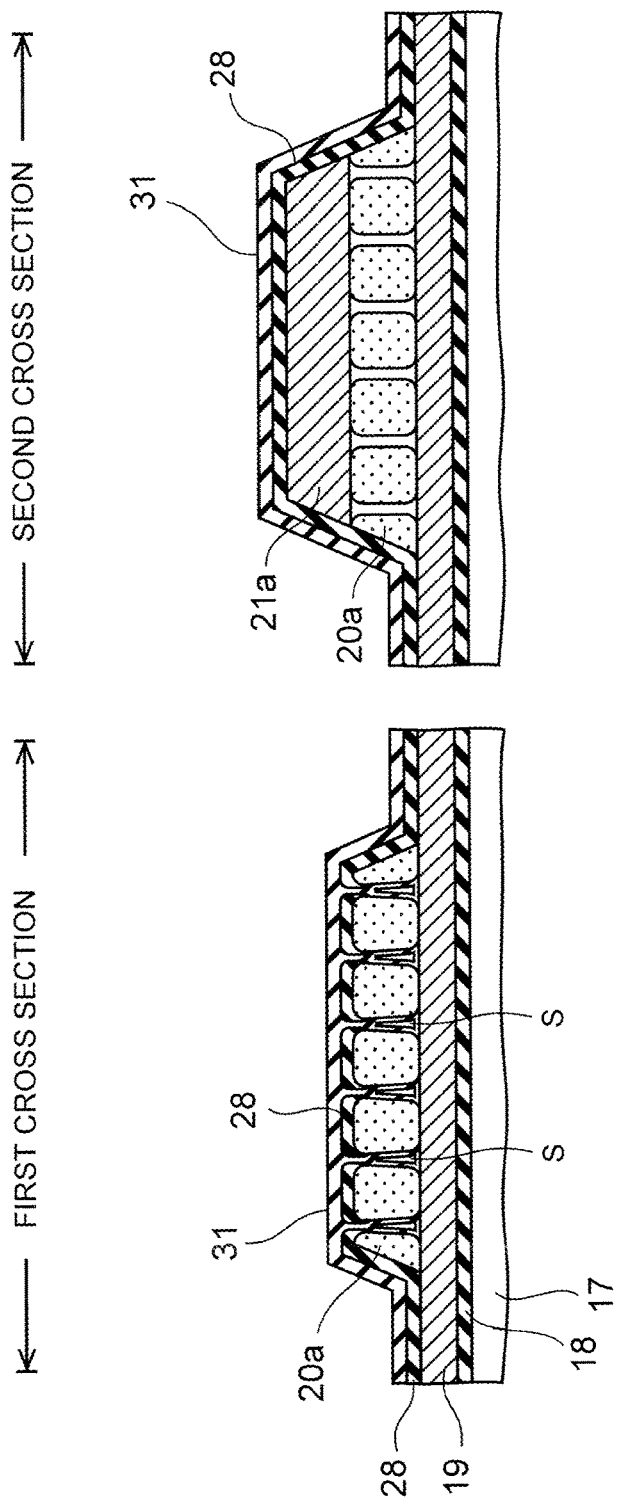

As illustrated in FIG. 8B, an alumina film serving as the second protective insulating film 31 is then formed on the first protective insulating film 28 by the ALD method to fill the gaps S with the second protective insulating film 31.

Examples of a raw material gas used for forming the alumina film by the ALD method include trimethyl aluminum (TMA), aluminum tri-sec-butoxide (Al(O-sec-$C_4H_9$)$_3$), and aluminum tri-iso-propoxide (Al(O-i-$C_3H_7$)$_3$).

Here, the second protective insulating film 31 formed by the ALD method has an excellent step coverage property, so that the second protective insulating film 31 is grown on the capacitor dielectric film 20a in the gaps S, and the gaps S are easily filled with the second protective insulating film 31.

Note that, in the present embodiment, since the second protective insulating film 31 is formed so as to fill the gaps S in this manner, the thickness of the second protective insulating film 31 is preferably large enough to fill the gaps S, and is herein about 30 nm to 40 nm, for example.

In addition, forming an alumina film having an excellent ability to prevent permeation of hydrogen as the second protective insulating film 31 may prevent the capacitor dielectric film 20a from being reduced by hydrogen in the outside atmosphere and deteriorated.

Moreover, in this step, although the raw material gas containing hydrogen such as TMA is used, the upper surface of the capacitor dielectric film 20a is covered in advance with the first protective insulating film 28, so that the capacitor dielectric film 20a does not remarkably deteriorate by hydrogen.

Figure 10B:
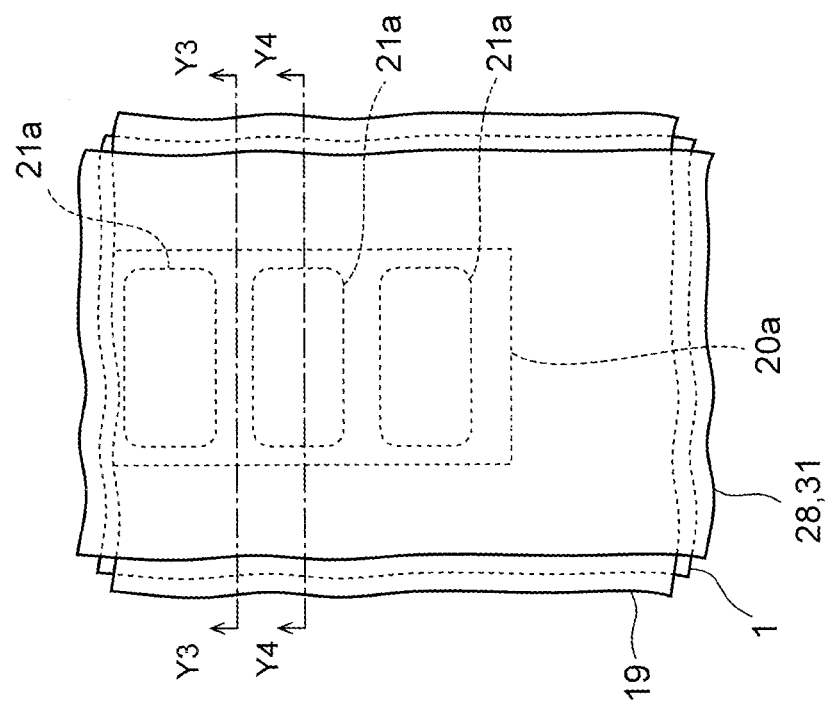

FIG. 10B is an enlarged plan view after the completion of this step, and the first cross section and the second cross section in FIG. 8B described above correspond to a cross section cut along the Y3-Y3 line and a cross section cut along the Y4-Y4 line in FIG. 10B, respectively.

Figure 8C:
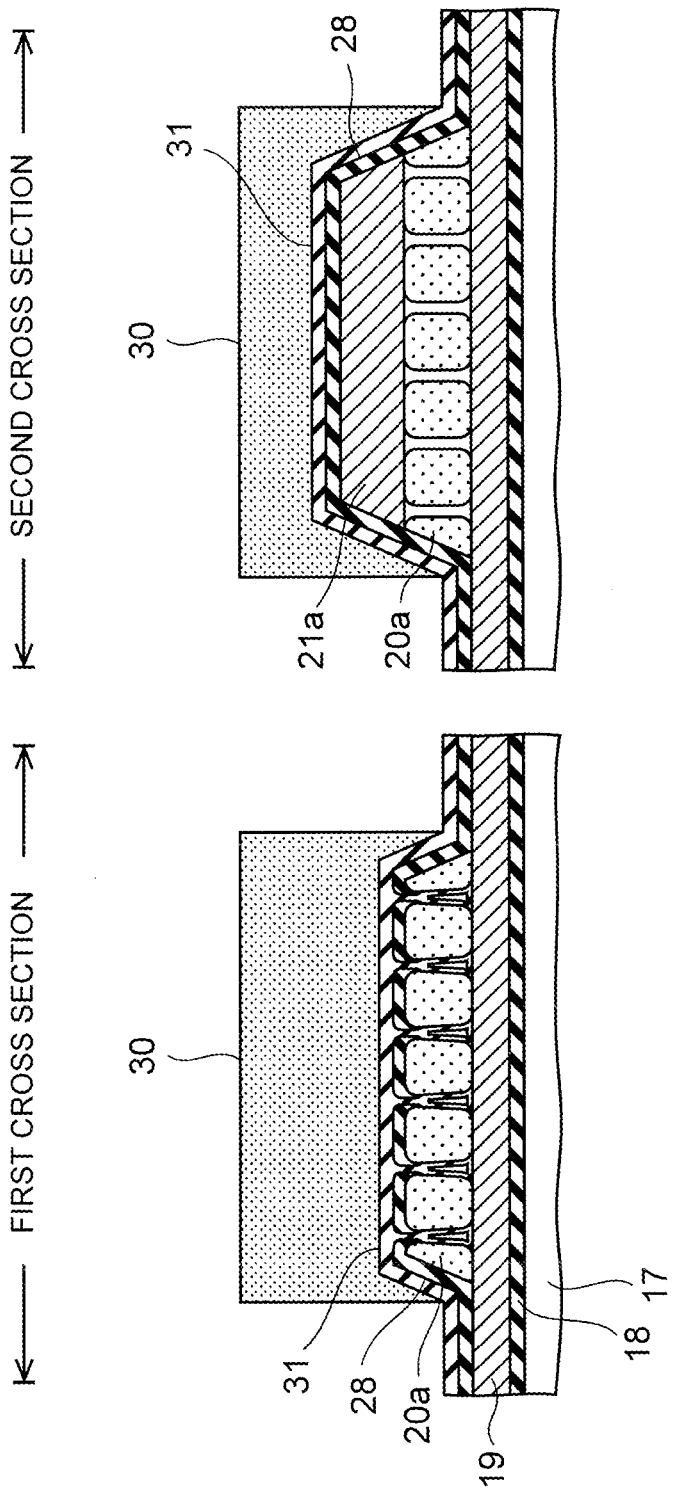

As illustrated in FIG. 8C, a photoresist is then applied onto the second protective insulating film 31, and the applied photoresist is exposed and developed to form the third resist film 30 having a shape of a capacitor lower electrode.

FIG. 10C is an enlarged plan view after the completion of this step, and the first cross section and the second cross section in FIG. 8C described above correspond to a cross section cut along the Y5-Y5 line and a cross section cut along the Y6-Y6 line in FIG. 10C, respectively.

As illustrated in FIG. 10C, the third resist film 30 having a stripe shape in plan view covers the capacitor dielectric film 20a and each of the upper electrodes 21a.

Figure 8D:
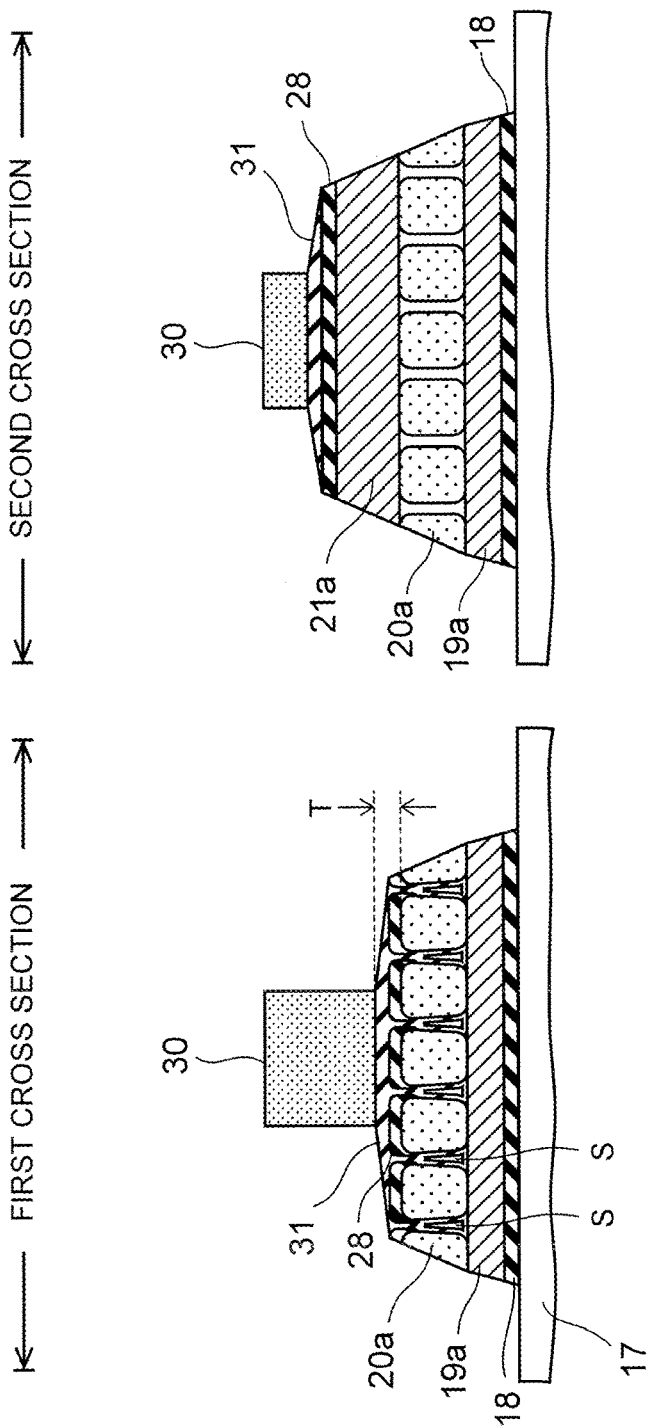

As illustrated in FIG. 8D, the first conductive film 19, the first protective insulating film 28, and the second protective insulating film 31 are subsequently dry etched using the third resist film 30 as a mask, and the remaining first conductive film 19 is used as the lower electrode 19a.

Moreover, this etching removes a portion of the second insulating adhesion film 18 which is not covered with the lower electrode 19a.

The etching gas used in this etching is not specially limited as long as a gas contains halogen capable of etching the first conductive film 19. In the present embodiment, chlorine is used as a halogen, and a mixed gas of chlorine gas and argon gas is used as an etching gas.

The third resist film 30 is also etched with the etching gas and the side surfaces of the third resist film 30 recede.

Herein, in the present embodiment, the gaps S of the capacitor dielectric film 20a are filled with the second protective insulating film 31 as described above, so that the gaps S are unlikely to be exposed in the etching atmosphere.

Therefore, unlike the step of FIG. 2G, the products R containing chlorine and the like hardly enter the gaps S.

Note that, in this etching, the first protective insulating film 28 and the second protective insulating film 31 above the capacitor dielectric film 20a are etched to some extent.

Therefore, it is preferable to make a total film thickness T of the protective insulating films 28 and 31 large enough so as to prevent the gaps S from being exposed in the etching atmosphere. For example, the gaps S may be prevented from being exposed in the etching atmosphere by setting the total film thickness T, at a point when this etching is finished, to a thickness which allows at least one of the protective insulating films 28 and 31 to remains on the capacitor dielectric film 20a in the spaces between the upper electrodes 21a.

Figure 10D:
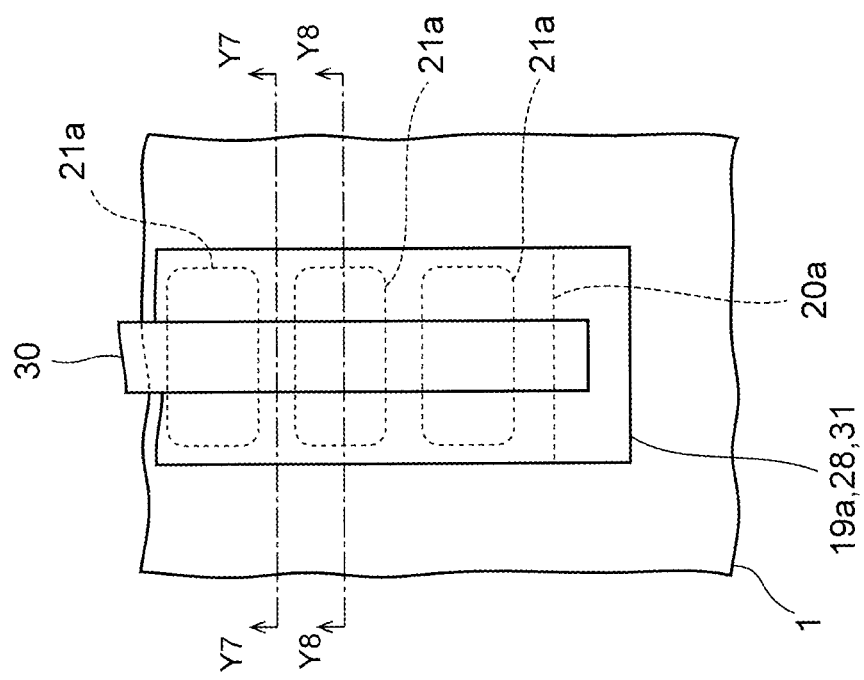

FIG. 10D is an enlarged plan view after the completion of this step, and the first cross section and the second cross section in FIG. 8D described above correspond to a cross section cut along the Y7-Y7 line and a cross section cut along the Y8-Y8 line in FIG. 10D, respectively.

Figure 8E:
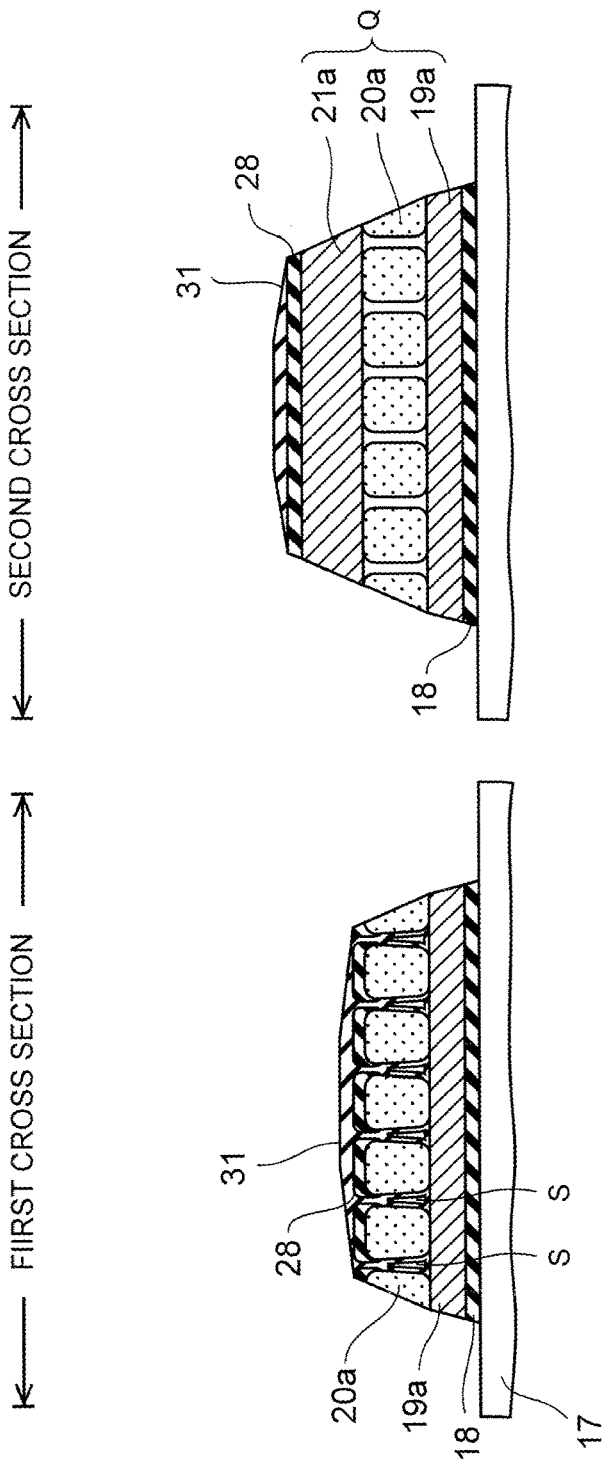

As illustrated in FIG. 8E, the third resist film 30 is subsequently removed by ashing.

With the foregoing steps, a basic structure of a ferroelectric capacitor Q is obtained in which the lower electrode 19a, the capacitor dielectric film 20a, and the upper electrodes 21a are stacked in this order.

There is a possibility that the ferroelectric capacitor Q may be deteriorated due to the reducing substance such as hydrogen because the upper electrodes 21a of the ferroelectric capacitor Q are protected by the protective insulating films 28 and 31 but the protective insulating films 28 and 31 are not formed on the side surfaces of the ferroelectric capacitor Q.

Figure 8F:
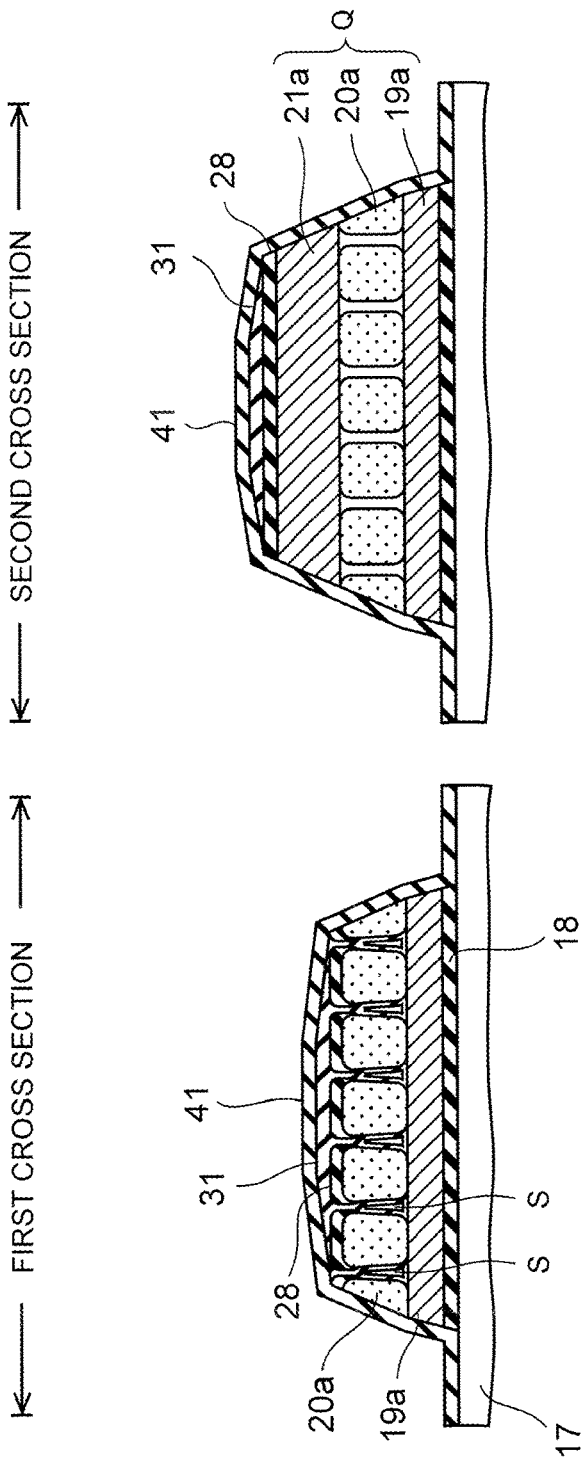

Therefore, in a next step, as illustrated in FIG. 8F, an alumina film serving as a third protective insulating film 41 is again formed on the second protective insulating film 31 and the side surfaces of the capacitor dielectric film 20a to prevent the reducing substance from penetrating into the capacitor dielectric film 20a.

The condition for forming the third protective insulating film 41 is not specially limited. In this example, the third protective insulating film 41 is formed by the ALD method, and has a film thickness in a range from about 20 nm to 100 nm.

Figure 10E:
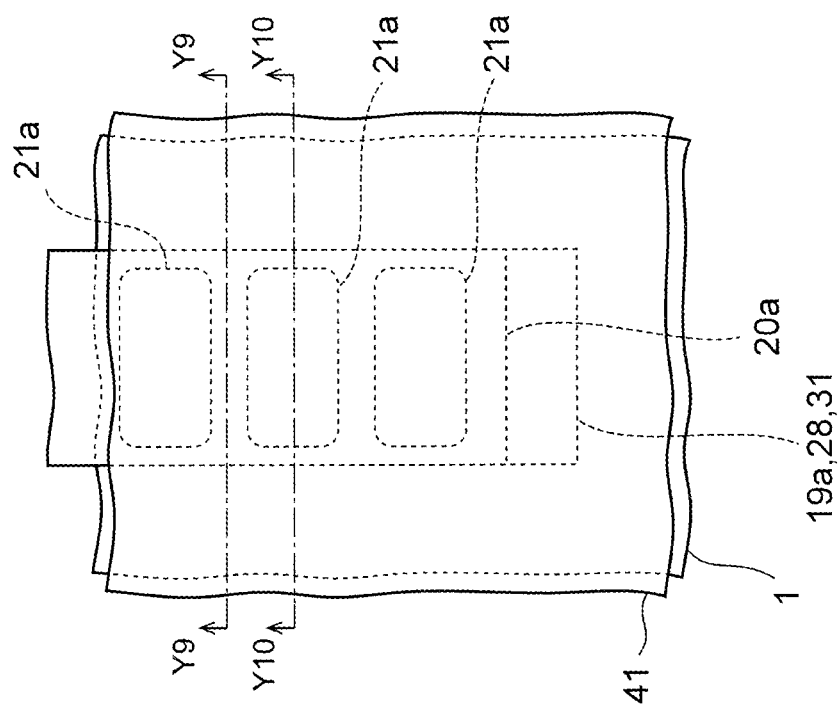

FIG. 10E is an enlarged plan view after the completion of this step, and the first cross section and the second cross section in FIG. 8F described above correspond to a cross section cut along the Y9-Y9 line and a cross section cut along the Y10-Y10 line in FIG. 10E, respectively.

Figure 8G:
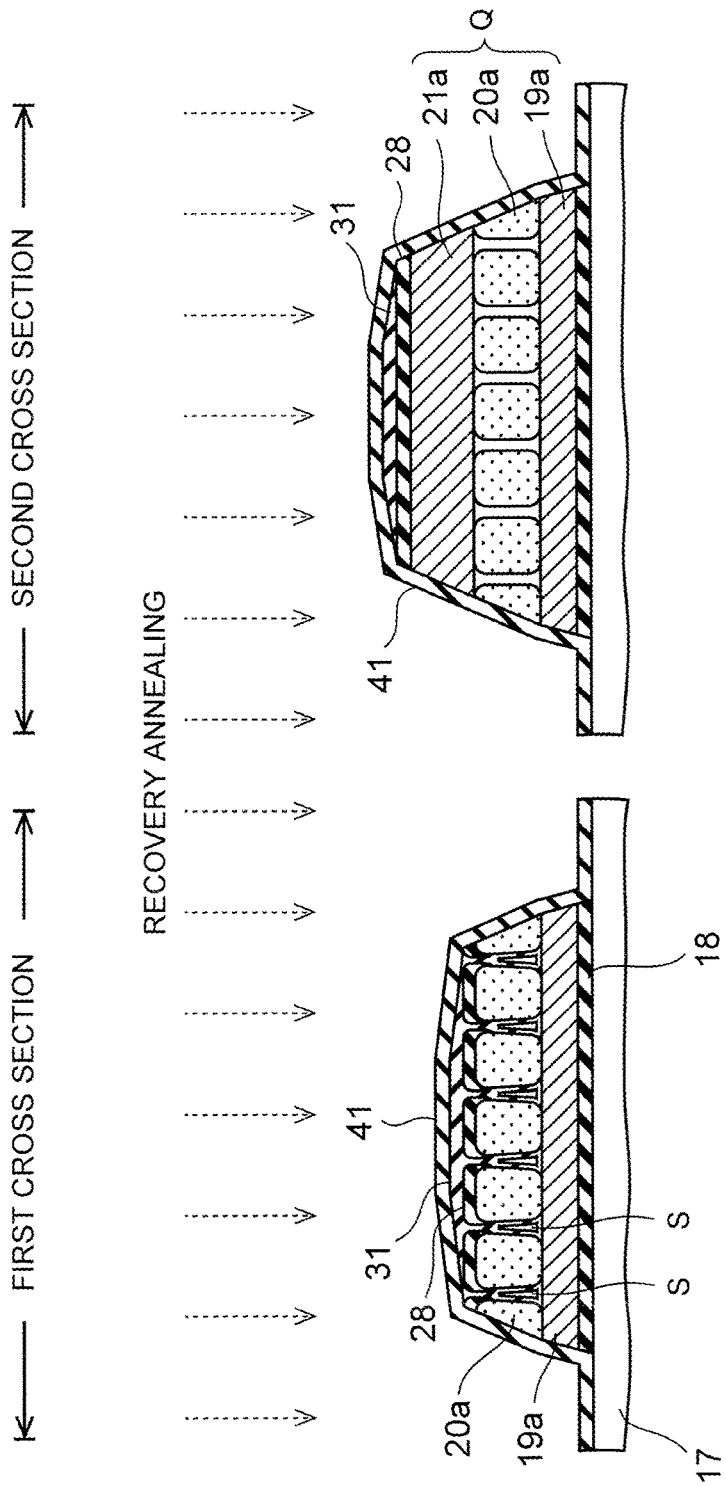

As illustrated in FIG. 8G, the recovery annealing is thereafter carried out in an oxygen-containing atmosphere for the capacitor dielectric film 20a to recover from the damage which the capacitor dielectric film 20a has received in the foregoing steps.

The recovery annealing is carried out, for example, in an atmosphere of oxygen 100% under conditions of the substrate temperature at 650° C. and the process time of about 40 minutes.

In the present embodiment, unlike the example of FIG. 2J, no product R by the etching is present in the gaps S of the capacitor dielectric film 20a. Therefore, there is no possibility of the lower electrode 19a being corroded by the product R even if the substrate is heated in this step.

The subsequent steps will be described with reference to FIG. 9A to FIG. 9F.

FIG. 9A to FIG. 9F are cross-sectional views of the semiconductor device in the course of manufacture according to the present embodiment.

Note that, in FIG. 9A to FIG. 9F, the same elements explained in FIG. 1A to FIG. 1D, FIG. 2A to FIG. 2J, and FIG. 3A to FIG. 3H are assigned with the same reference numerals, and explanations thereof are omitted hereinafter.

Figure 9A:
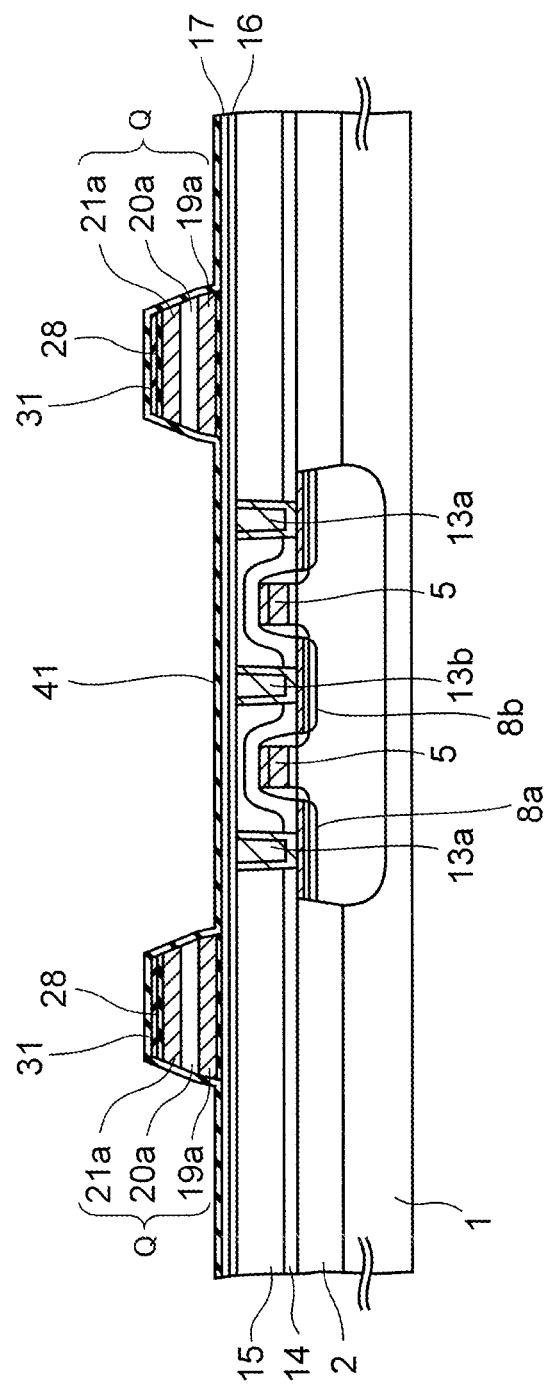
FIG. 9A to FIG. 9F are cross-sectional views of the semiconductor device in the course of manufacture according to the present embodiment.

Firstly, the abovementioned steps of FIG. 8A to FIG. 8G are carried out to obtain a state where the third protective insulating film 41 is formed on the entire upper surface of the silicon substrate 1, as illustrated in FIG. 9A.

Figure 9B:
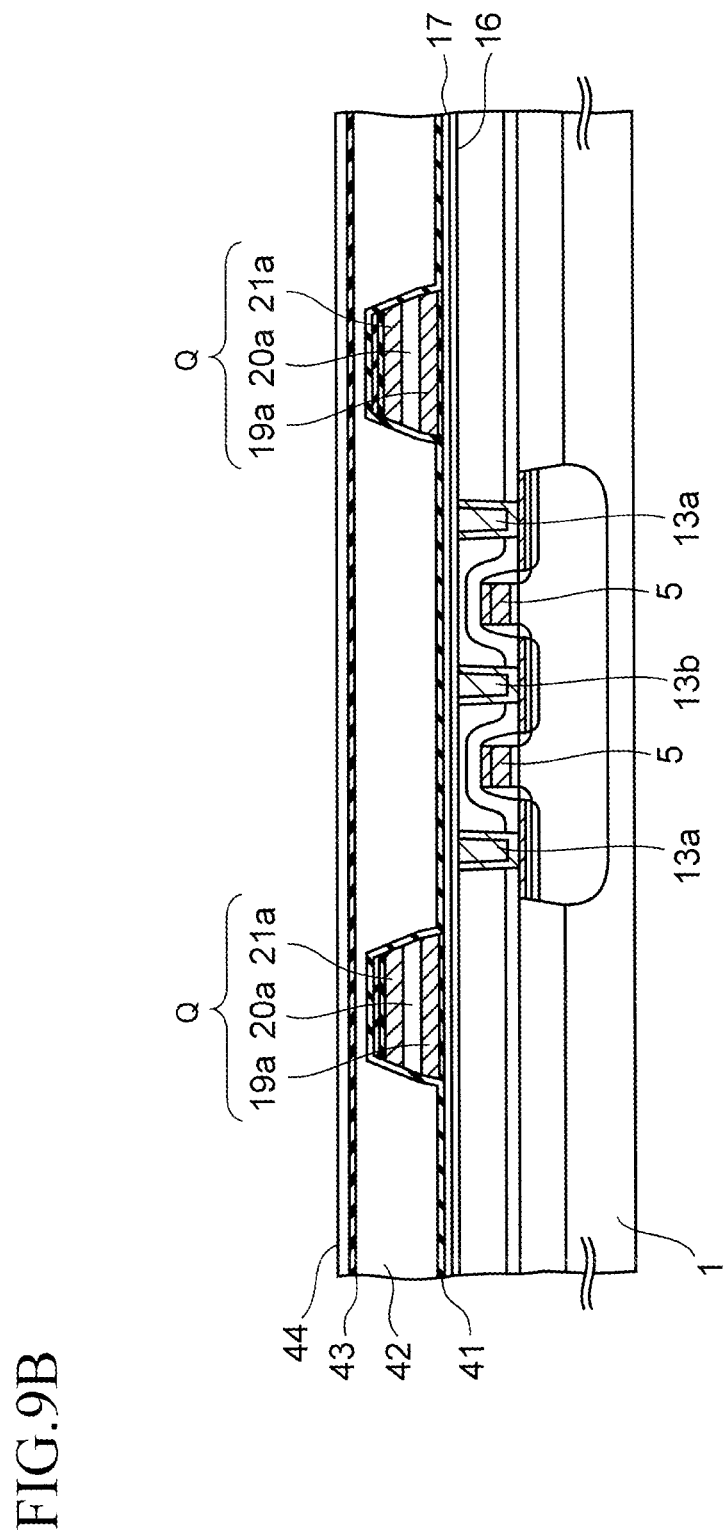

As illustrated in FIG. 9B, a silicon oxide film serving as a second interlayer insulating film 42 is then formed with a thickness of approximately 1400 nm on the third protective insulating film 41 by the plasma CVD method which uses TEOS gas as a reaction gas. Unevenness portions reflected by the shape of the ferroelectric capacitor Q are formed on the upper surface of the second interlayer insulating film 42. Therefore, the upper surface of the second interlayer insulating film 42 is polished by the CMP method to be planarized so as to eliminate the unevenness portions.

In addition, annealing is carried out for the second interlayer insulating film 42 under conditions of the substrate temperature at 350° C. and the process time of two minutes in a $N_2O$ plasma atmosphere to dehydrate the second interlayer insulating film 42 and to nitride a surface of the second interlayer insulating film 42, thereby preventing moisture from being again adsorbed thereon.

This annealing may be carried out in an $N_2$ plasma atmosphere instead of $N_2O$ plasma.

Further, an alumina film is formed with a thickness in a range from 20 nm to 50 nm as a fourth protective insulating film 43 for protecting the ferroelectric capacitor Q against hydrogen and moisture which are generated in the subsequent steps on the second interlayer insulating film 42 by the sputtering method or the ALD method.

In addition, a silicon oxide film is formed as a cap insulating film 44 with a thickness of approximately 300 nm on the fourth protective insulating film 43 by the plasma CVD method which uses TEOS gas.

Figure 9C:
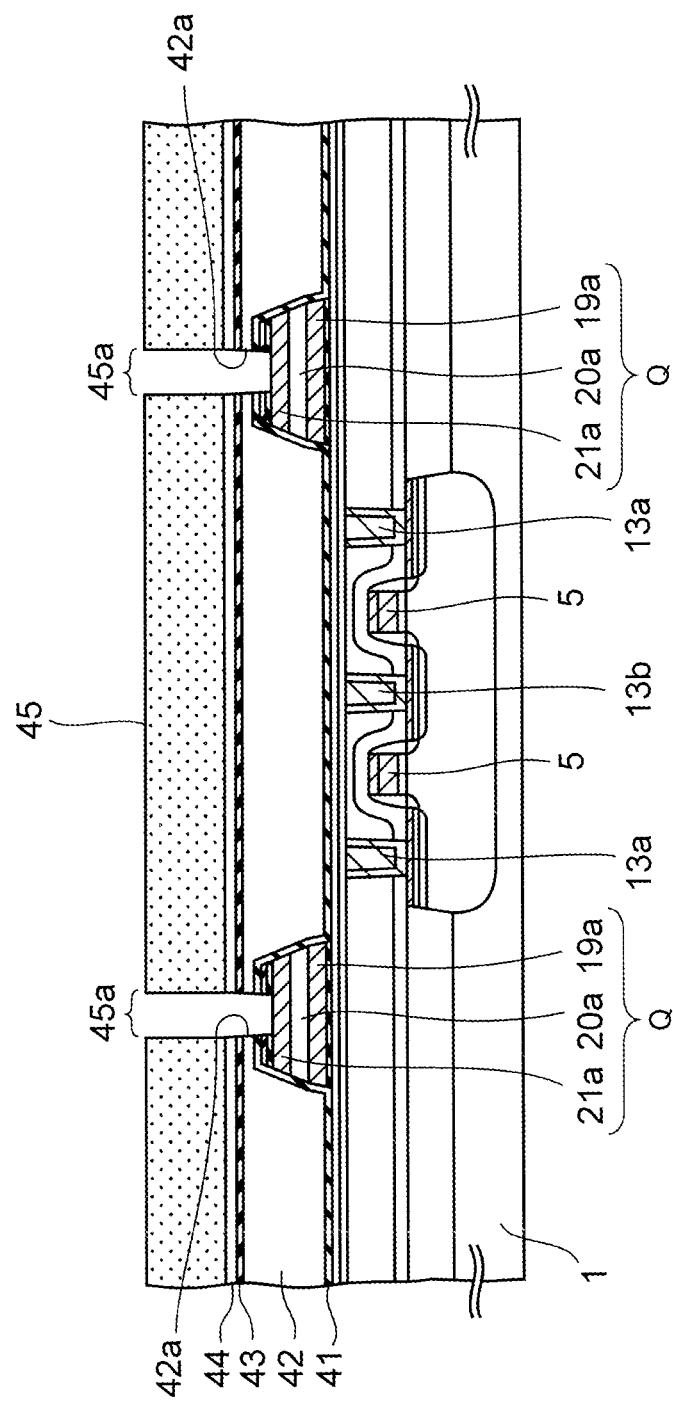

As illustrated in FIG. 9C, a photoresist is subsequently applied onto the cap insulating film 44, and the applied photoresist is exposed and developed to form a fourth resist film 45.

Dry etching is carried out through windows 45a of the fourth resist film 45 to form first holes 42a in each of the insulating films 41 to 44 above the upper electrodes 21a. Examples of the etching gas which is used in this dry etching include a mixed gas of $C_4F_8$, Ar, $O_2$, and CO.

Thereafter, the fourth resist film 45 is removed by ashing.

Figure 9D:
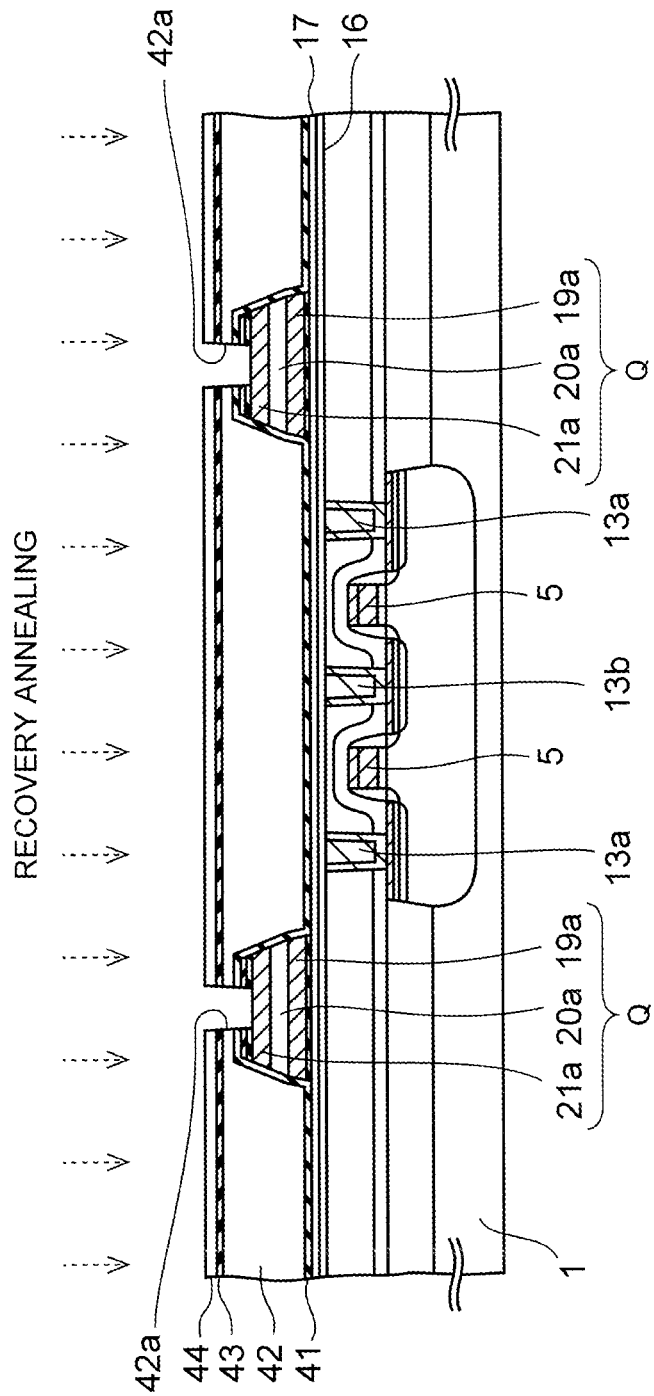
Figure 10F:
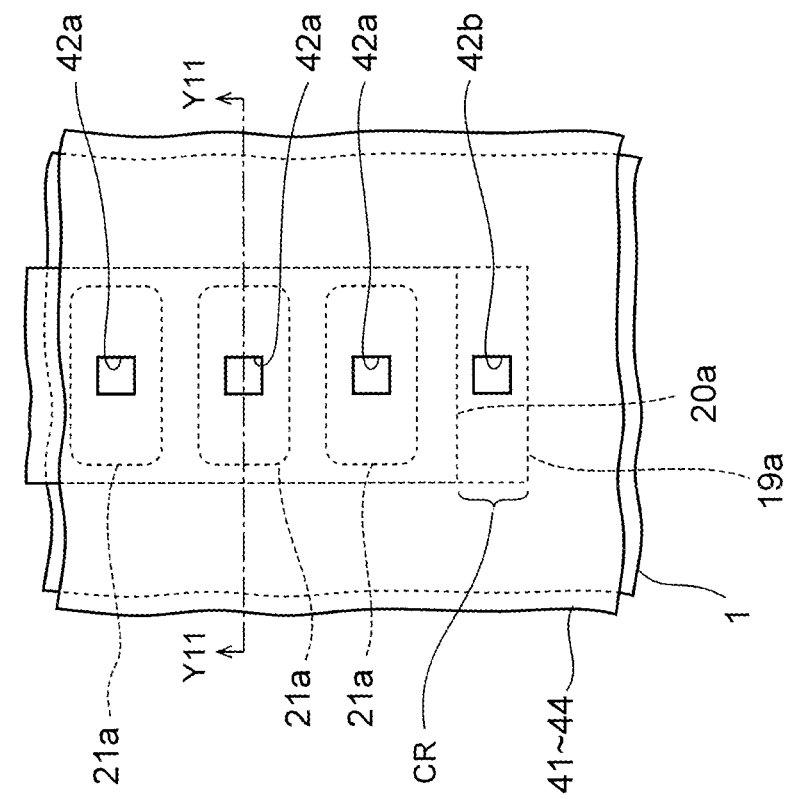

FIG. 10F is an enlarged plan view after the completion of this step, and the cross section of the capacitor Q in FIG. 9D described above corresponds to a cross-sectional view cut along the Y11-Y11 line in FIG. 10F.

As illustrated in FIG. 10F, a second hole 42b is formed in each of the insulating films 41 to 44 on a contact region CR at an end portion of the lower electrode 19a by the etching in this step.

As illustrated in FIG. 9D, recovery annealing is then carried out in an oxygen-containing atmosphere to recover from a damage which the capacitor dielectric film 20a has received in the foregoing steps.

The condition for the recovery annealing is not specially limited, and the recovery annealing may be carried out under conditions of the substrate temperature at 400° C. to 600° C. for approximately 60 minutes, for example.

Moreover, there is no possibility that the lower electrode 19a is corroded due to the products R by the etching also in this step for the same reason as that for the recovery annealing in FIG. 8G.

Figure 9E:
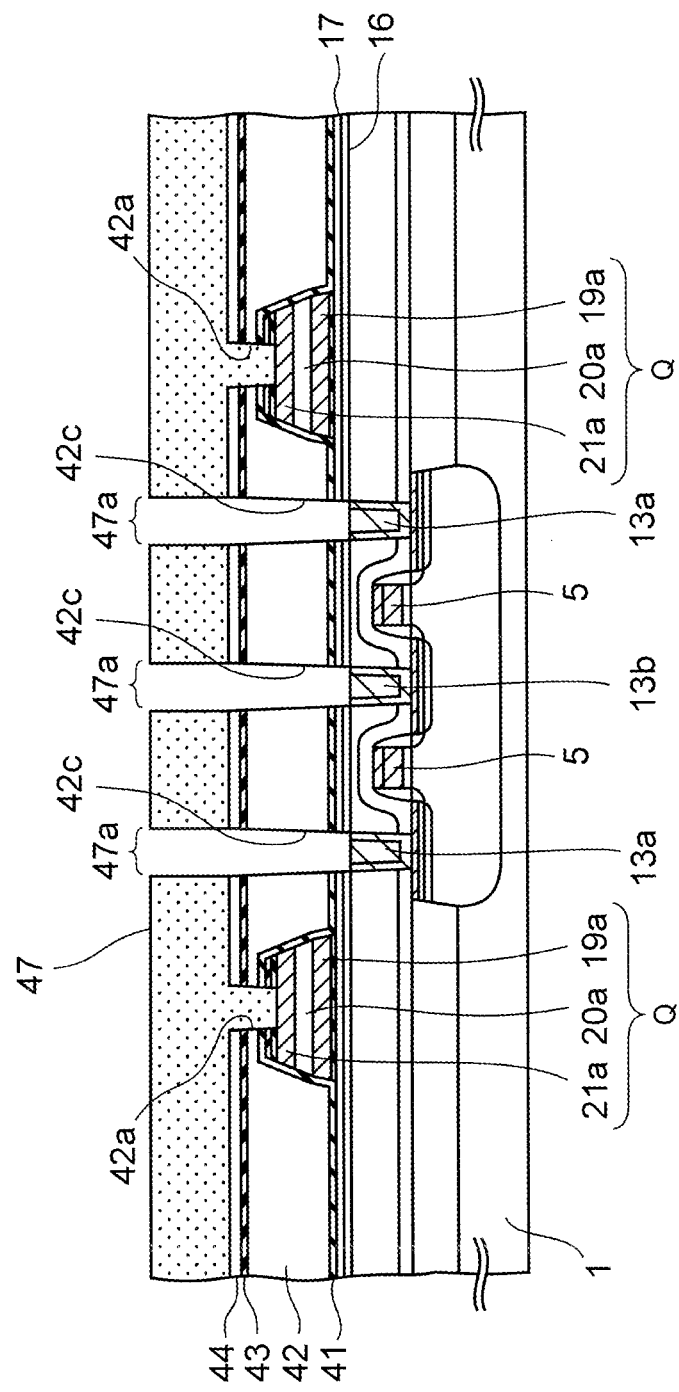

Further, as illustrated in FIG. 9E, a photoresist is applied onto the cap insulating film 44, and the applied photoresist is exposed and developed to form a fifth resist film 47 including hole-shaped windows 47a on the contact plugs 13a and 13b. Note that, the first holes 42a are covered by the fifth resist film 47.

Each of the insulating films 16 to 17 and 41 to 44 are dry etched through the windows 47a to form third holes 42c on the contact plugs 13a and 13b.

Such etching is carried out by a plasma etching device which uses a mixed gas of $C_4F_8$, Ar, $O_2$, and CO as an etching gas, and the etching stops at the oxidation prevention insulating film 16 functioning as a stopper film in the etching.

As for the etching gas to the oxidation prevention insulating film 16, a mixed gas of $CHF_3$, Ar, and $O_2$ is used.

Thereafter, the fifth resist film 47 is removed.

Next, steps for obtaining a structure illustrated in the cross-sectional view in FIG. 9F will be described.

Firstly, for clarifying inner surfaces of the first to third holes 42a to 42c, these inner surfaces of the holes 42a to 42c are exposed in an argon atmosphere which is converted into plasma by high frequency power, and the inner surfaces are subjected to sputter etching.

Next, a titanium nitride film serving as a glue film is formed with a thickness in a range from 50 nm to 150 nm on the inner surfaces of the first to third holes 42a to 42c and an upper surface of the cap insulating film 44 by the sputtering method.

A tungsten film is then formed on the glue film by the CVD method to entirely embed the first to third holes 42a to 42c with the tungsten film.

Unnecessary portions of the glue film and tungsten film on the upper surface of the cap insulating film 44 are thereafter polished by the CMP method and removed, and these films are left as first to third conductor plugs 50a to 50c in the first to third holes 42a to 42c.

Among these conductor plugs, the first conductor plugs 50a are connected to the upper electrodes 21a, and the third conductor plugs 50c are connected to the contact plugs 13a and 13b.

Figure 9F:
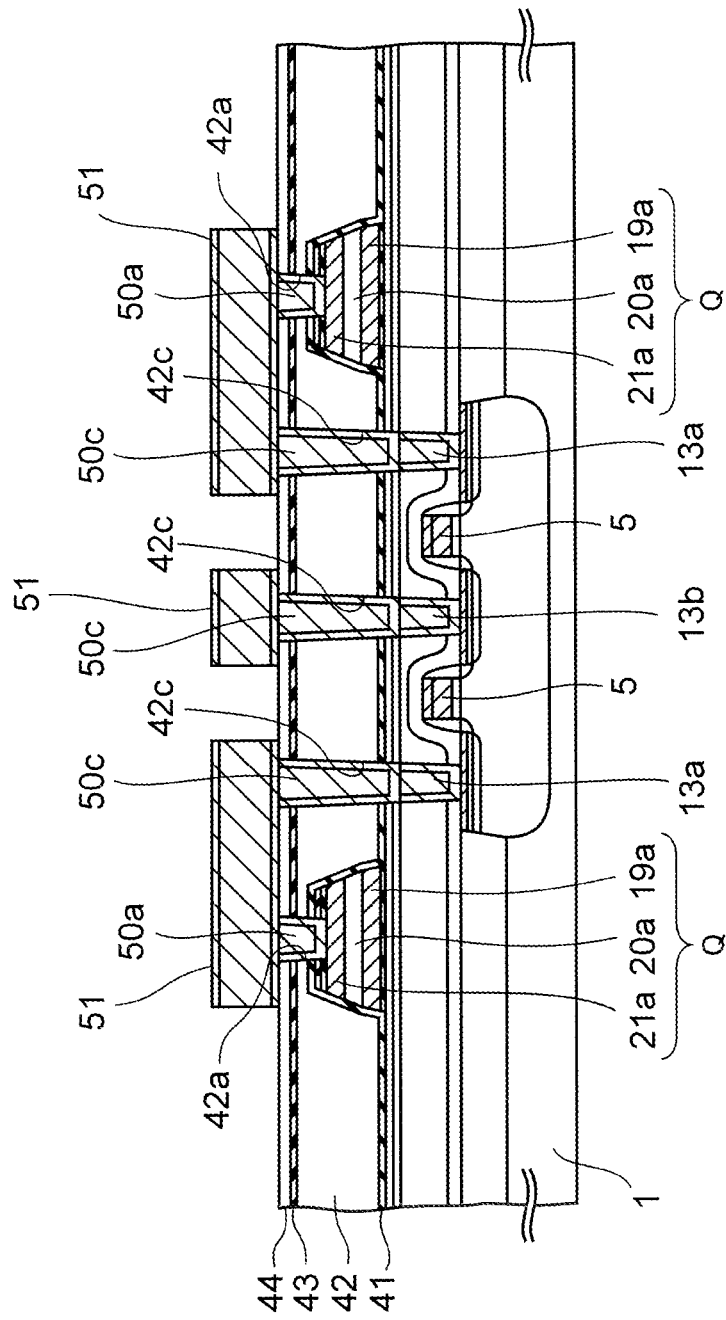
Figure 10G:
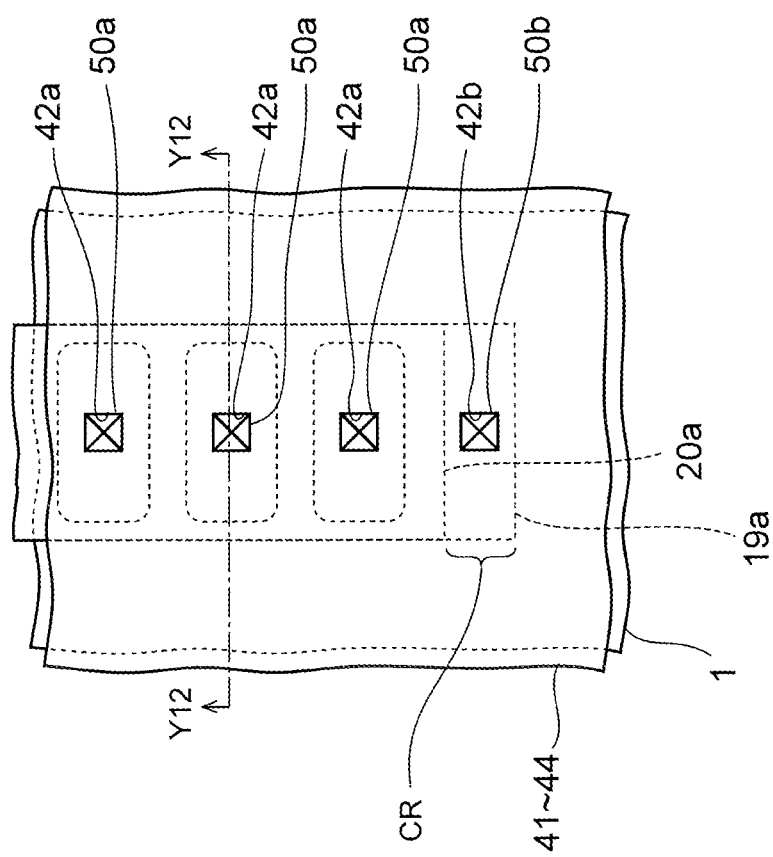

FIG. 10G is an enlarged plan view after the completion of this step, and the cross section of the capacitor Q in FIG. 9F described above corresponds to a cross-sectional view cut along the Y12-Y12 line in FIG. 10G.

As illustrated in FIG. 10G, the second conductor plug 50b is connected to the lower electrode 19a in the contact region CR.

A metal laminated film is thereafter formed on each upper surface of the conductor plugs 50a to 50c and the cap insulating film 44 by the sputtering method as is in FIG. 9F, and thereafter, the metal laminated film is patterned to form metal wiring 51.

The metal laminated film includes a TiN film with a thickness of 50 nm, a copper-containing aluminum film with a thickness of 550 nm, a Ti film with a thickness of 5 nm, and a Ti film with a thickness of 50 nm, in this order from the bottom.

Further, the n-type source-drain region 8a is electrically connected to the upper electrode 21a via the metal wiring 51.

With the foregoing steps, the basic structure of the semiconductor device according to the present embodiment is completed.

With the present embodiment, as illustrated in FIG. 8B, the gaps S of the capacitor dielectric film 20a are filled with the second protective insulating film 31 formed by the ALD method to prevent the products which are generated when the first conductive film 19 is etched in the step of FIG. 8D from entering the gaps S. Therefore, even when the substrate is heated by the recovery annealing in FIG. 8G or FIG. 9D, the lower electrode 19a is not corroded due to the products in the gaps S, so that the recess 19x as in FIG. 6 may be prevented from being formed in the lower electrode 19a.

This may prevent the residual polarization charge amount Pr from lowering due to the recesses 19x as the lowering illustrated in FIG. 7, thereby allowing the electrical characteristics of the ferroelectric capacitor Q to be maintained and thus yield of the semiconductor device to be improved.

Note that, although the case where the surface of the first conductive film 19 is exposed from the gaps S is exemplified in FIG. 8A, the form of the gap S is not limited to that in this case.

Figure 11:
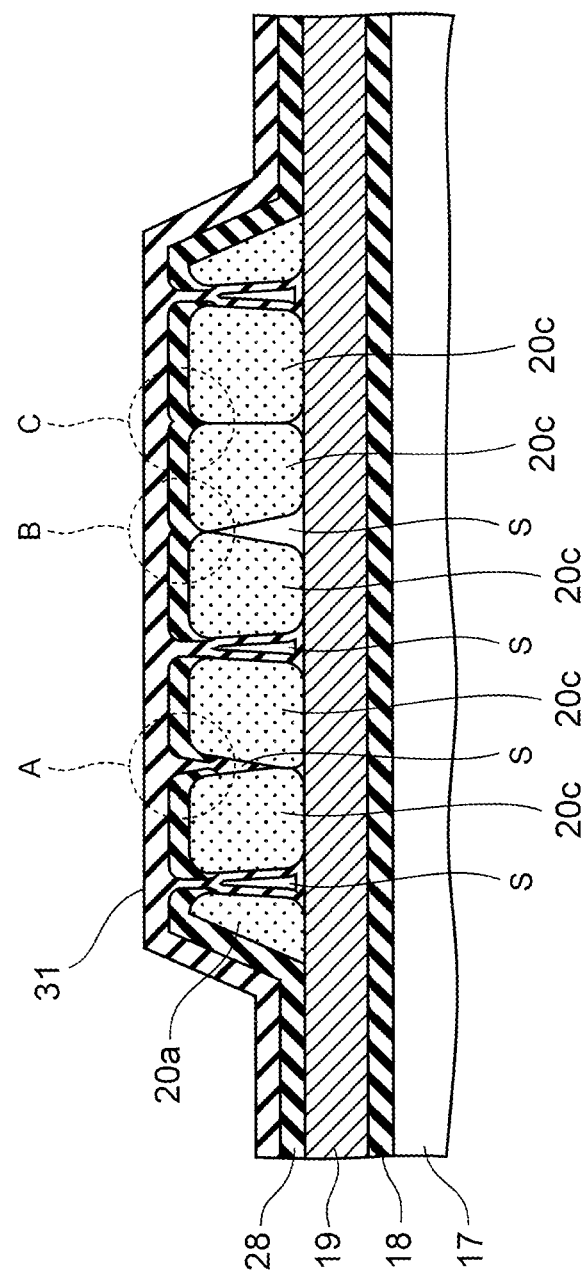
FIG. 11 is an enlarged cross-sectional view illustrating various forms of gaps of a capacitor dielectric film in the present embodiment.

FIG. 11 is an enlarged cross-sectional view illustrating various forms of gaps of the capacitor dielectric film 20a.

A lower portion of the gap S is closed at an A portion of FIG. 11, and the first conductive film 19 is not exposed in the gap S. An upper portion of the gap S is closed at a B portion. Adjacent two crystal grains 20c are in contact with each other, and no gap S is generated at a C portion.

In any one of these A to C portions, the first conductive film 19 is not exposed through the gap S, so that there is no possibility that the lower electrode 19a is corroded by the product which is generated in the etching step in FIG. 8D.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   an insulating film formed above a semiconductor substrate;
   a lower electrode formed on the insulating film;
   a dielectric film formed on the lower electrode, the dielectric film including a ferroelectric and having gaps generated along a grain boundary of the dielectric film;
   a plurality of upper electrodes formed at intervals on the dielectric film to form a ferroelectric capacitor together with the lower electrode and the dielectric film;
   a first protective insulating film formed on portions of the dielectric film excluding the gaps, and on the upper electrodes; and
   a second protective insulating film formed on the first protective insulating film and on the dielectric film in the gaps such that the gaps are filled with the second protective insulating film.

2. The semiconductor device according to claim 1, further comprising:

a third protective insulating film formed on the second protective insulating film and on a side surface of the dielectric film.

3. The semiconductor device according to claim 1, wherein the first protective insulating film is not formed at a lower portion of the gap.

4. The semiconductor device according to claim 1, wherein the first protective insulating film is formed to overhang an opening end at an upper portion of the gap.

5. The semiconductor device according to claim 1, wherein the second protective insulating film has a better step coverage property than a step coverage property of the first protective insulating film.

6. The semiconductor device according to claim 1, wherein the dielectric film includes an upper side surfaces and a lower side surface;
   the lower side surface contacts the lower electrode; and
   the gaps are communicated from the upper side surface to the lower side surface.

* * * * *